(12) United States Patent
Yumoto

(10) Patent No.: US 7,379,039 B2
(45) Date of Patent: May 27, 2008

(54) CURRENT DRIVE CIRCUIT AND DISPLAY DEVICE USING SAME PIXEL CIRCUIT, AND DRIVE METHOD

(75) Inventor: Akira Yumoto, Kanagawa (JP)

(73) Assignee: Sony Corporation (JP)

( * ) Notice: Subject to any disclaimer, the term of this patent is extended or adjusted under 35 U.S.C. 154(b) by 543 days.

(21) Appl. No.: 10/784,828

(22) Filed: Feb. 24, 2004

(65) Prior Publication Data

US 2004/0207615 A1    Oct. 21, 2004

Related U.S. Application Data

(62) Division of application No. 09/787,036, filed on Aug. 13, 2001, now Pat. No. 6,859,193.

(51) Int. Cl.
*G09G 3/32* (2006.01)

(52) U.S. Cl. .................. 345/82; 345/76; 315/169.1; 313/498

(58) Field of Classification Search ........... 345/76–84, 345/204, 211, 55, 62; 315/169.1, 169.3, 315/169.4; 313/498–500, 505
See application file for complete search history.

(56) References Cited

U.S. PATENT DOCUMENTS 5,023,489 A    6/1991   Macbeth (Continued)

FOREIGN PATENT DOCUMENTS

EP        0 397 253      11/1990

(Continued)

OTHER PUBLICATIONS

Dawson R M A et al.: "The Impact of the Transient Response of Organic Light Emitting Diodes on the Design of Active Matrix Oled Display," Internation Electron Devices Meetin 1998. IEDM Technical Digent. San Francisco, CA, Dec. 6-9, 1998, New York, NY: IEEE, US, Dec. 6, 1998, pp. 875-878, XP000859508.

(Continued)

*Primary Examiner*—Richard Hjerpe
*Assistant Examiner*—Kimnhung Nguyen
(74) *Attorney, Agent, or Firm*—Rader Fishman & Grauer PLLC; Ronald P. Kananen

(57) ABSTRACT

A display device including a current drive circuit capable of stably and correctly supplying an intended current to a light emitting element of each pixel without being affected by variations in characteristics of an active element inside the pixel and as a result capable of displaying a high quality image, wherein each pixel comprises a receiving use transistor TFT3 for fetching a signal current Iw from a data line DATA when a scanning line SCAN-A is selected, a conversion use transistor TFT1 for once converting a current level of a fetched signal current Iw to a voltage level and holding the same, and a drive use transistor TFT2 for passing a drive current having a current level in accordance with the held voltage level through a light emitting element OLED. The conversion use thin film transistor TFT1 generates a converted voltage level at its own gate by passing the signal current Iw fetched by the TFT3 through its own channel. A capacitor C holds the voltage level created at the gate of the TFT1. The TFT2 passes the drive current having a current level in accordance with the held voltage level through the light emitting element OLED.

57 Claims, 19 Drawing Sheets

U.S. PATENT DOCUMENTS

| | | | |
|---|---|---|---|
| 5,852,425 A * | 12/1998 | Bird et al. | 345/92 |
| 5,923,309 A * | 7/1999 | Ishizuka et al. | 345/82 |
| 5,952,789 A * | 9/1999 | Stewart et al. | 315/169.4 |
| 5,966,110 A * | 10/1999 | Van Zalinge | 345/82 |
| 6,246,384 B1 * | 6/2001 | Sano | 345/76 |
| 6,359,605 B1 * | 3/2002 | Knapp et al. | 345/76 |
| 6,369,785 B1 * | 4/2002 | Imai | 345/76 |
| 6,373,454 B1 | 4/2002 | Knapp et al. | |
| 6,489,952 B1 * | 12/2002 | Tanaka et al. | 345/205 |
| 6,501,448 B1 * | 12/2002 | Komiya et al. | 345/80 |

FOREIGN PATENT DOCUMENTS

| | | |
|---|---|---|
| JP | 1-279670 | 11/1989 |
| JP | 03-004383 | 1/1991 |
| JP | 03-075978 | 3/1991 |
| JP | 03-100784 | 4/1991 |
| JP | 9-197313 | 7/1997 |
| JP | 9-263810 | 10/1997 |
| JP | 09-281465 | 10/1997 |
| JP | 10-062817 | 3/1998 |
| JP | 10-319872 | 12/1998 |
| JP | 10-319908 | 12/1998 |
| JP | 11-282419 | 10/1999 |
| WO | WO-98/48403 | 10/1998 |
| WO | WO-99/65011 | 12/1999 |
| WO | WO-99/65012 | 12/1999 |

OTHER PUBLICATIONS

Supplementary Partial European Search Report; Application No. EP 00 94 6353; dated Jun. 12, 2006.

Japanese Office Action; Application No. 2001-211659; Dated: Sep. 4, 2007.

* cited by examiner

FIG.6A scanA

FIG.6B scanB

FIG.6C CURRENT OF CS

FIG.6D OLED BRIGTHNESS

PREVIOUS CYCLE DATA | VALID DATA | NEW CYCLE DATA

FIG.17A
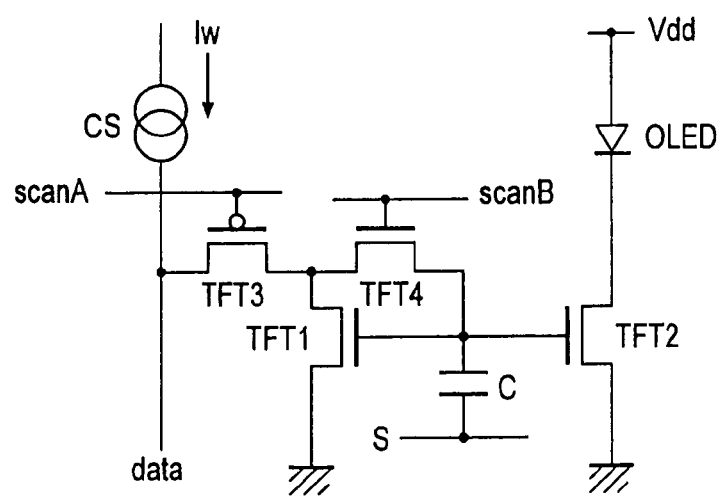
FIG.17B
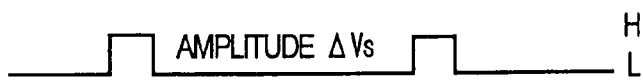
FIG.17

CURRENT DRIVE CIRCUIT AND DISPLAY DEVICE USING SAME PIXEL CIRCUIT, AND DRIVE METHOD

The present application is a divisional of the patent application Ser. No. 09/787,036, filed on Aug. 13, 2001 now U.S. Pat. No. 6,859,193.

TECHNICAL FIELD

The present invention relates to a current drive circuit for driving an organic electroluminescence (EL) element or other light emitting element controlled in brightness by a current, a display device providing a light emitting element driven by this current drive circuit for every pixel, a pixel circuit, and a method for driving a light emitting element. In more detail, the present invention relates to a current drive circuit for controlling an amount of the current supplied to a light emitting element by an insulating gate type field effect transistor or other active element provided in each pixel and a so-called active matrix type image display device using the same.

BACKGROUND ART

In general, in an active matrix type image display device, an image is displayed by arranging a large number of pixels in a matrix and controlling a light intensity for every pixel in accordance with given brightness information. When using a liquid crystal as an electro-optical substance, the transmittance of each pixel varies in accordance with a voltage written into the pixel. In an active matrix type image display device using an organic electroluminescence (EL) material as the electro-optical substance as well, the basic operation is similar to that of the case where a liquid crystal is used. However, unlike a liquid crystal display, an organic EL display is a so-called self-luminescent type having a light emitting element for every pixel, so has the advantages of a better visual recognition of the image in comparison with a liquid crystal display, no need for back light, and a fast response speed. The brightnesses of individual light emitting elements are controlled by the amount of current. Namely, this display is largely different from a liquid crystal display in the point that the light emitting elements are current driven types or current controlled types.

In the same way as a liquid crystal display, in an organic EL display as well, there are a simple matrix and an active matrix drive methods. The former is simple in structure, but makes it difficult to realize a large sized, high definition display, so the active matrix method is being vigorously developed. The active matrix method controls the current flowing through the light emitting element provided in each pixel by an active element (generally a thin film transistor, one type of the insulating gate type field effect transistor, hereinafter sometimes referred to as a "TFT") provided inside the pixel. An organic EL display of this active matrix method is disclosed in for example Japanese Unexamined Patent Publication (Kokai) No. 8-234683. One pixel's worth of an equivalent circuit is shown in FIG. 1. The pixel is comprised of a light emitting element OLED, a first thin film transistor TFT1, a second thin film transistor TFT2, and a holding capacitor C. The light emitting element is an organic electroluminescence (EL) element. An organic EL element has a rectification property in many cases, so is sometimes referred to as an OLED (organic light emitting diode). In the figure, the symbol of a diode is used to indicate the light emitting element OLED. However, the light emitting element is not always limited to an OLED and may be any element controlled in brightness by the amount of the current flowing through it. Also, a rectification property is not always required in the light emitting element. In the illustrated example, a source of the TFT2 is set at a reference potential (ground potential), an anode of the light emitting element OLED is connected to Vdd (power supply potential), and a cathode is connected to a drain of the TFT2. On the other hand, a gate of the TFT1 is connected to a scanning line SCAN, the source is connected to a data line DATA, and the drain is connected to the holding capacitor C and the gate of the TFT2.

In order to operate the pixel, first, when the scanning line SCAN is brought to a selected state and a data potential Vw representing the brightness information is applied to the data line DATA, the TFT1 becomes conductive, the holding capacitor C is charged or discharged, and the gate potential of the TFT2 coincides with the data potential Vw. When the scanning line SCAN is brought to an unselected state, the TFT1 becomes OFF and the TFT2 is electrically separated from the data line DATA, but the gate potential of the TFT2 is stably held by the holding capacitor C. The current flowing through the light emitting element OLED via the TFT2 becomes a value in accordance with a gate/source voltage Vgs, and the light emitting element OLED continuously emits the light with a brightness in accordance with the amount of the current supplied through the TFT2.

When the current flowing between the drain and source of the TFT2 is Ids, this is the drive current flowing through the OLED. Assuming that the TFT2 operates in the saturated region, Ids is represented by the following equation.

$$Ids = \mu \cdot Cox \cdot W/L/2(Vgs - Vth)^2 \qquad (1)$$
$$= \mu \cdot Cox \cdot W/L/2(Vw - Vth)^2 2$$

Here, Cox is the gate capacity per unit area and is given by the following equation:

$$Cox = \epsilon 0 \cdot \epsilon r/d \qquad (2)$$

In equation (1) and equation (2), Vth indicates a threshold value of the TFT2, μ indicates a mobility of a carrier, W indicates a channel width, L indicates a channel length, ε0 indicates a permittivity of vacuum, εr indicates a dielectric constant of the gate insulating film, and d is a thickness of the gate insulating film.

According to equation (1), Ids can be controlled by the potential Vw written into the pixel. As a result, the brightness of the light emitting element OLED can be controlled. Here, the reason for the operation of the TFT2 in the saturated region is as follows. Namely, this is because, in the saturated region, Ids is controlled by only the Vgs and does not depend upon the drain/source voltage Vds. Therefore, even if Vds fluctuates due to variations in the characteristics of the OLED, a predetermined amount of the drive current Ids can be passed through the OLED.

As mentioned above, in the circuit configuration of the pixel shown in FIG. 1, when written by Vw once, the OLED continues emitting light with a constant brightness during one scanning cycle (one frame) until next rewritten. If large number of such pixels are arranged in a matrix as in FIG. 2, an active matrix type display device can be configured. As shown in FIG. 2, in a conventional display device, scanning lines SCAN-1 through SCAN-N for selecting pixels 25 in a predetermined scanning cycle (for example a frame cycle according to an NTSC standard) and data lines DATA giving brightness information (data potential Vw) for driving the pixels 25 are arranged in a matrix. The scanning lines SCAN-1 through SCAN-N are connected to a scanning line drive circuit 21, while the data lines DATA are connected to a data line drive circuit 22. By repeating the writing of Vw from the data lines DATA by the data line drive circuit 22 while successively selecting the scanning lines SCAN-1 through SCAN-N by the scanning line drive circuit 21, an intended image can be displayed. In a simple matrix type display device, the light emitting element contained in each pixel emits light only at an instant of selection. In contrast, in the active matrix type display device shown in FIG. 2, the light emitting element of each pixel 25 continues to emit light even after finishing being written. Therefore, in particular in a large sized, high definition display, there is the advantage that the level of the drive current of the light emitting elements can be lowered in comparison with the simple matrix type.

FIG. 3 schematically shows a sectional structure of the pixel 25 shown in FIG. 2. Note, only OLED and TFT2 are represented for facilitating the illustration. The OLED is configured by successively superposing a transparent electrode 10, an organic EL layer 11, and a metal electrode 12. The transparent electrode 10 is separated for every pixel, acts as the anode of the OLED, and is made of a transparent conductive film for example ITO. The metal electrode 12 is commonly connected among pixels and acts as the cathode of the OLED. Namely, the metal electrode 12 is commonly connected to a predetermined power supply potential Vdd. The organic EL layer 11 is a composite film obtained by superposing for example a positive hole transport layer and an electron transport layer. For example, Diamyne is vapor deposited on the transparent electrode 10 acting as the anode (positive hole injection electrode) as the positive hole transport layer, Alq3 is vapor deposited thereon as the electron transport layer. Further, a metal electrode 12 acting as the cathode (electron injection electrode) is grown thereon. Note that, Alq3 represents 8-hydroxy quinoline aluminum. The OLED having such a laminate structure is only one example. When a voltage in a forward direction (about 10V) is applied between the anode and the cathode of the OLED having such a configuration, injection of carriers such as electrons and positive holes occurs and luminescence is observed. The operation of the OLED can be considered to be the emission of light by excisions formed by the positive holes injected from the positive hole transport layer and the electrons injected from the electron transport layer.

On the other hand, the TFT2 comprises a gate electrode 2 formed on a substrate 1 made of glass or the like, a gate insulating film 3 superimposed on the top surface thereof, and a semiconductor thin film 4 superimposed above the gate electrode 2 via this gate insulating film 3. This semiconductor thin film 4 is made of for example a polycrystalline silicon thin film. The TFT2 is provided with a source S, a channel Ch, and a drain D acting as a passage of the current supplied to the OLED. The channel Ch is located immediately directly above the gate electrode 2. The TFT2 of this bottom gate structure is coated by an inter-layer insulating film 5. A source electrode 6 and a drain electrode 7 are formed above that. Above them, the OLED mentioned above is grown via another inter-layer insulating film 9. Note that, in the example of FIG. 3, the anode of the OLED is connected to the drain of the TFT2, so a P-channel thin film transistor is used as the TFT2.

In an active matrix type organic EL display, generally a TFT (thin film transistor) formed on a glass substrate is utilized as the active element. This is for the following reason. Namely, an organic EL display is a direct viewing type. Due to this, it becomes relatively large in size. Due to restrictions of cost and manufacturing facilities, a usage of a single crystalline silicon substrate for the formation of the active elements is not practical. Further, in order to extract the light from the light emitting elements, usually a transparent conductive film of ITO (indium tin oxide) is used as the anode of the organic EL layer, but ITO is frequently generally grown under a high temperature which an organic EL layer cannot endure. In this case, it is necessary to form the ITO before the formation of the organic EL layer. Accordingly, the manufacture process roughly becomes as follows:

Referring to FIG. 3 again, first the gate electrode 2, gate insulating film 3, and semiconductor thin film 4 comprised of amorphous silicon are successively stacked and patterned on the glass substrate 1 to form the TFT2. In certain cases, the amorphous silicon is sometimes formed into polysilicon (polycrystalline silicon) by heat treatment such as laser annealing. In this case, generally a TFT2 having a larger degree of carrier mobility in comparison with amorphous silicon and a larger current driving capability can be formed. Next, an ITO transparent electrode 10 acting as the anode of the light emitting element OLED is formed. Subsequently, an organic EL layer 11 is stacked to form the light emitting element OLED. Finally, the metal electrode 12 acting as the cathode of the light emitting element is formed by a metal material (for example aluminum).

In this case, the extraction of the light is started from a back side (bottom surface side) of the substrate 1, so a transparent material (usually a glass) must be used for the substrate 1. In view of this, in an active matrix type organic EL display, a relatively large sized glass substrate 1 is used. As the active element, ordinarily use is made of a TFT as it can be relatively easily formed thereon. Recently, attempts have also been made to extract the light from a front side (top surface side) of the substrate 1. The sectional structure in this case is shown in FIG. 4. The difference of this from FIG. 3 resides in that the light emitting element OLED is comprised by successively superposing a metal electrode 12a, an organic EL layer 11, and a transparent electrode 10a and an N-channel transistor is used as the TFT2.

In this case, the substrate 1 does not have to be transparent like glass, but as the transistor formed on a large sized substrate, use is generally still made of a TFT. However, the amorphous silicon and polysilicon used for the formation of the TFT have a worse crystallinity in comparison with single crystalline silicon and have a poor controllability of the conduction mechanism, therefore it has been known that there is a large variation in characteristics in formed TFTs. Particularly, when a polysilicon TFT is formed on a relatively large sized glass substrate, usually the laser annealing method is used as mentioned above in order to avoid the problem of thermal deformation of the glass substrate, but it is difficult to uniformly irradiate laser energy to a large glass substrate. Occurrence of variations in the state of the crystallization of the polysilicon according to the location in the substrate cannot be avoided.

As a result, it is not rare for the Vth (threshold value) to vary according to pixel by several hundreds of mV, in certain cases, 1V or more, even in the TFTs formed on an identical substrate. In this case, even if a same signal potential Vw is written with respect to for example different pixels, the Vth will vary according to the pixels. As a result, according to equation (1) described above, the current Ids flowing through the OLEDs will largely vary for every pixel and consequently become completely off from the intended value, so a high quality of image cannot be expected as the display. A similar thing can be said for not only the Vth, but also the variation of parameters of equation (1) such as the carrier mobility μ. Further, a certain degree of fluctuation in the above parameters is unavoidable not only due to the variation among pixels as mentioned above, but also variations for every manufacturing lot or every product. In such a case, it is necessary to determine how the data line potential Vw should be set with respect to the intended current Ids to be passed through the OLEDs for every product in accordance with the final state of the parameters of equation (1). Not only is this impractical in the mass production of displays, but it is also extremely difficult to devise countermeasures for fluctuations in characteristics of the TFTs due to the ambient temperature and changes of the TFT characteristics occurring due to usage over a long period of time.

DISCLOSURE OF THE INVENTION

An object of the present invention is to provide a current drive circuit capable of stably and accurately supplying an intended current to a light emitting element etc. of a pixel without being affected by variations in characteristics of an active element inside the pixel, a display device using the same and as a result capable of displaying a high quality image, a pixel circuit, and a method for driving a light emitting element.

In order to achieve the object, the following means were devised. Namely, a display device according to the present invention provides a scanning line drive circuit for successively selecting scanning lines, a data line drive circuit including a current source for generating a signal current having a current level in accordance with brightness information and successively supplying the same to data lines, and a plurality of pixels arranged at intersecting portions of the scanning lines and the data lines and including current driven type light emitting elements emitting light by receiving the supply of the drive current. The characterizing feature is that each pixel comprises a receiving part for fetching the signal current from the data line when the scanning line is selected, a converting part for converting a current level of the fetched signal current to a voltage level and holding the same, and a drive part for passing a drive current having a current level in accordance with the held voltage level through the light emitting element. Specifically, the converting part includes a conversion use insulating gate type field effect transistor provided with a gate, a source, a drain, and a channel and a capacitor connected to the gate. The conversion use insulating gate type field effect transistor generates a converted voltage level at the gate by passing the signal current fetched by the receiving part through the channel. The capacitor holds the voltage level created at the gate. Further, the converting part includes a switch use insulating gate type field effect transistor inserted between the drain and the gate of the conversion use insulating gate type field effect transistor. The switch use insulating gate type field effect transistor becomes conductive when converting the current level of the signal current to the voltage level and electrically connects the drain and the gate of the conversion use insulating gate type field effect transistor to create the voltage level with the source as the reference at the gate, while the switch use insulating gate type field effect transistor is shut off when the capacitor holds the voltage level and separates the gate of the conversion use insulating gate type field effect transistor and the capacitor connected to this from the drain.

In one embodiment, the drive part includes a drive use insulating gate type field effect transistor provided with a gate, a drain, a source, and a channel. This drive use insulating gate type field effect transistor receives the voltage level held at the capacitor at its gate and passes a drive current having a current level in accordance with that through the light emitting element via the channel. A current mirror circuit is configured by direct connection of the gate of the conversion use insulating gate type field effect transistor and the gate of the drive use insulating gate type field effect transistor, whereby a proportional relationship is exhibited between the current level of the signal current and the current level of the drive current. The drive use insulating gate type field effect transistor is formed in the vicinity of the corresponding conversion use insulating gate type field effect transistor inside the pixel and has an equivalent threshold voltage to that of the conversion use insulating gate type field effect transistor. The drive use insulating gate type field effect transistor operates in the saturated region and passes a drive current in accordance with a difference between the level of the voltage applied to the gate thereof and the threshold voltage through the light emitting element.

In another embodiment, the drive part shares the conversion use insulating gate type field effect transistor together with the converting part in a time division manner. The drive part separates the conversion use insulating gate type field effect transistor from the receiving part and uses the same for driving after the conversion of the signal current is completed and passes the drive current to the light emitting element through the channel in a state where the held voltage level is applied to the gate of the conversion use insulating gate type field effect transistor. The drive part has a controlling means for cutting off an unnecessary current flowing to the light emitting element via the conversion use insulating gate type field effect transistor at times other than the time of drive. The controlling means cuts off the unnecessary current by controlling a voltage between terminals of a two terminal type light emitting element having a rectification function. Alternatively, the controlling means comprises a control use insulating gate type field effect transistor inserted between the conversion use insulating gate type field effect transistor and the light emitting element, and the control use insulating gate type field effect transistor becomes nonconductive in state and separates the conversion use insulating gate type field effect transistor and the light emitting element when the light emitting element is not driven and switches to the conductive state when the light emitting element is driven. In addition, the controlling means controls a ratio between a time for cutting off the drive current when the light emitting element is not to be driven and placing the light emitting element in the non-light emitting state and a time of passing the drive current when the light emitting element is to be driven and placing the light emitting element in the light emitting and thereby to enable the control of the brightness of the pixel. According to a certain case, the drive part has a potential fixing means for fixing the potential of the drain with reference to the source of the conversion use insulating gate type field effect transistor in order to stabilize the current level of the drive current flowing to the light emitting element through the conversion use insulating gate type field effect transistor.

In a further developed form of the present invention, the receiving part, the converting part, and the drive part configure a current circuit combining a plurality of insulating gate type field effect transistors, and one or two or more insulating gate type field effect transistors have a double gate structure for suppressing current leakage in the current circuit. Further, the drive part includes the insulating gate type field effect transistor provided with the gate, drain, and the source and passes the drive current passing between the drain and the source to the light emitting element in accordance with the level of the voltage applied to the gate, the light emitting element is a two terminal type having an anode and a cathode, and the cathode is connected to the drain. Alternatively, the drive part includes an insulating gate type field effect transistor provided with a gate, a drain, and a source and passes a drive current passing between the drain and the source to the light emitting element in accordance with the level of the voltage applied to the gate, the light emitting element is a two terminal type having an anode and a cathode, and the anode is connected to the source. Further, it includes an adjusting means for downwardly adjusting the voltage level held by the converting part and supplying the same to the drive part to tighten the black level of the brightness of each pixel. In this case, the drive part includes an insulating gate type field effect transistor having a gate, a drain, and a source, and the adjusting means downwardly adjusts the level of the voltage applied to the gate by raising the bottom of the voltage between the gate and the source of the insulating gate type field effect transistor. Alternatively, the drive part includes an insulating gate type field effect transistor having a gate, a drain, and a source, the converting part is provided with a capacitor connected to the gate of the thin film transistor and holding the voltage level, and the adjusting means comprises an additional capacitor connected to that capacitor and downwardly adjusts the level of the voltage to be applied to the gate of the insulating gate type field effect transistor held at that capacitor. Alternatively, the drive part includes an insulating gate type field effect transistor having a gate, a drain, and a source, the converting part is provided with a capacitor connected to the gate of the insulating gate type field effect transistor on its one end and holding the voltage level, and the adjusting means adjusts the potential of the other end of the capacitor when holding the voltage level converted by the converting part at that capacitor to downwardly adjust the level of the voltage to be applied to the gate of the insulating gate type field effect transistor. Note that, as the light emitting element, use is made of for example an organic electroluminescence element.

The pixel circuit of the present invention has the following characteristic features. First, the brightness information is written to a pixel by passing a signal current having a magnitude in accordance with the brightness through the data line. That current flows between the source and the drain of the conversion use insulating gate type field effect transistor inside the pixel and as a result creates a voltage between the gate and source in accordance with the current level. Second, the voltage between the gate and source created as described above or the gate potential is held by the function of the capacitor formed inside the pixel or existing parasitically and is held at about that level for a predetermined period even after the end of the writing. Third, the current flowing through the OLED is controlled by the conversion use insulating gate type field effect transistor per se connected to it in series or the drive use insulating gate type field effect transistor provided inside the pixel separately from that and having a gate commonly connected together with the conversion use insulating gate type field effect transistor. The voltage between the gate and source at the OLED drive is generally equal to the voltage between the gate and source of the conversion use insulating gate type field effect transistor created according to the first characterizing feature. Fourth, at the time of writing, the data line and the internal portion of the pixel are made conductive by a fetch use insulating gate type field effect transistor controlled by the first scanning line, and the gate and the drain of the conversion use insulating gate type field effect transistor are short-circuited by the switch use insulating gate type field effect transistor controlled by the second scanning line. Summarizing the above, while in the conventional example, the brightness information was given in the form of a voltage value, in contrast, the remarkable characterizing feature of the display device of the present invention is that the brightness information is given in the form of a current value, that is, of a current written type.

As already mentioned, an object of the present invention is to accurately pass the intended current through the OLEDs without being affected by variations in the characteristics of the TFTs. The reason why the present object can be achieved by the first through fourth characterizing features will be explained below. Note that hereinafter the conversion use insulating gate type field effect transistor will be described as the TFT1, the drive use insulating gate type field effect transistor will be described as the TFT2, the fetch use insulating gate type field effect transistor will be described as the TFT3, and the switch use insulating gate type field effect transistor will be described as the TFT4. Note that the present invention is not limited to TFTs (thin film transistors). Insulating gate type field effect transistors can be widely employed as the active elements, for example, single crystalline silicon transistors formed on a single crystalline silicon substrate or SOI substrate. The signal current passing through the TFT1 at the time of writing of the brightness information is defined as Iw, and the voltage between the gate and source created in the TFT1 as a result of this is defined as Vgs. At the time of writing, due to the TFT4, the gate and the drain of the TFT1 are short-circuited, so the TFT1 operates in the saturated region. Accordingly, Iw is given by the following equation.

$$Iw = \mu1 \cdot Cox1 \cdot W1/L1/2(Vgs-Vth1)^2 \qquad (3)$$

Here, the meanings of the parameters are similar to the case of equation (1). Next, when defining the current flowing through an OLED as Idrv, Idrv is controlled in its current level by the TFT2 connected to the OLED in series. In the present invention, the voltage between the gate and source thereof coincides with Vgs in equation (3). Therefore, when assuming that the TFT2 operates in the saturated region, the following equation stands:

$$Idrv = \mu2 \cdot Cox \ 2 \cdot W2/L2/2(Vgs-Vth2)^2 \qquad (4)$$

The meanings of the parameters are similar to the case of equation (1). Note that, the condition for the operation of the insulating gate type field effect transistor in the saturated region is generally given by the following equation while defining Vds as the voltage between the drain and source.

$$|Vds| > |Vgs-Vth| \qquad (5)$$

Here, TFT1 and TFT2 are formed close inside a small pixel, so it can be considered that de facto $\mu1=\mu2$, $Cox1=Cox2$, and $Vth1=Vth2$. Then, at this time, the following equation is easily derived from equation (3) and equation (4):

$$Idrv/Iw = (W2/L2)/(W1/L1) \qquad (6)$$

The point to be noted here resides in the fact that, in equation (3) and equation (4), the values of $\mu$, Cox, and Vth per se vary for every pixel, every product, or every manufacturing lot, but equation (6) does not include these parameters, so the value of Idrv/Iw is not affected by such variation of them. For example, when designing W1=W2 and L1=L2, Idrv/Iw=1 stands, that is, Iw and Idrv become an identical value. Namely, the drive current Idrv flowing through the OLED becomes accurately identical to the signal current Iw without being affected by variations in the characteristics of the TFT. Therefore, as a result, the light emitting brightness of the OLED can be accurately controlled. The above description is just one example. As will be explained below by giving embodiments, the ratio of Iw and Idrv can be freely determined according to how W1, W2, L1, and L2 are set. Alternatively, it is also possible to use the same TFT for the TFT1 and TFT2.

In this way, according to the present invention, the correct current can be passed through the OLED without being affected by variations in the characteristics of the TFT. Further, according to equation (6), there is the large advantage of the simple proportional relationship between Iw and Idrv. Namely, in the conventional example of FIG. 1, as shown in equation (1), Vw and Idrv are nonlinear and are affected by variations in the characteristics of the TFT, so the control of the voltage at the drive side becomes complex. Further, it is seen that the carrier mobility μ among the characteristics of the TFT shown in equation (1) fluctuates according to the temperature. In this case, in the conventional example, according to equation (1), Idrv, and accordingly the light emitting brightness of the OLED, changes, but according to the present invention, such a worry does not exist. The value of Idrv given by equation (6) can be stably supplied to the OLED.

In equation (4), it was assumed that the TFT2 operated in the saturated region, but the present invention is effective in also a case where the TFT2 operates in a linear region. Namely, where the TFT2 operates in the linear region, Idrw is given by the following equation:

$$Idrv = \mu 2 \cdot Cox2 \cdot W2/L2 * \{(Vgs-Vth2)Vds2-Vds2^2/2\} \quad (7)$$

Vds2 is the voltage between the drain and source of TFT2. Here, when assuming that TFT1 and TFT2 are arranged close and as a result Vth1=Vth2=Vth stands, Vgs and Vth can be deleted from equation (3) and equation (7) and the following equation is obtained:

$$Idrv = \mu 2 \cdot Cox2 \cdot W2/L2 * \{(2Iw \cdot L1/\mu 1 \cdot Cox1 \cdot W1)^{1/2}Vds2 - Vds2^2/2\} \quad (8)$$

In this case, the relationship between Iw and Idrv does not become a simple proportional relationship as in equation (6), but Vth is not contained in equation (8). Therefore, it is seen that the relationship of Iw and Idrv is not affected by the variation of Vth (variation in a screen or variation for every manufacturing lot). Namely, by writing the predetermined Iw without being affected by variation of the Vth, the intended Idrv can be obtained. Note, where μ and Cox vary in the screen, due to these values, even if a specific Iw is given to the data line, the value of Idrv determined from equation (8) will vary. Therefore desirably the TFT2 operates in the saturated region as mentioned before.

Further, more preferably the TFT3 and the TFT4 are controlled by different scanning lines, and the TFT4 is brought to the off state preceding the TFT3 at the end of the write operation. In the pixel circuit according to the present invention, the TFT3 and the TFT4 do not have to be the same conductivity type. The pixel circuit may be configured so that the TFT3 and the TFT4 are an identical or different conductivity types, the gates of them controlled by different scanning lines, and the TFT4 brought to the off state preceding to the TFT3 at the end of the write operation.

Further, when the TFT3 and the TFT4 are controlled by different scanning lines, after the end of the write operation, the TFT4 may be brought to the on state by the operation of the scanning line, and the pixels extinguished in units of the scanning lines. This is because, the gate and the drain of the TFT1 and the gate of the TFT2 are connected, so the gate voltage of the TFT2 becomes the threshold value of the TFT1 (this is almost equal to the threshold value of the TFT2), and both of the TFT1 and TFT2 become the off state.

In this way, by changing the timing of the extinguishing signal, it is possible to conveniently and freely change the brightness of the display device. If the second scanning line is divided into colors of R, G, and B and separately controlled, adjustment of the color balance is also easy.

Further, where it is desired to obtain the same time average brightness, the drive current of a light emitting element OLED can be made larger by reducing the ratio of the light emitting period (duty).

BRIEF DESCRIPTION OF THE DRAWINGS

FIGS. 17A and 17B are circuit diagrams of a modification of the embodiment of FIG. 15.

BEST MODE FOR CARRYING OUT THE INVENTION

Below, embodiments of the present invention will be explained by referring to the attached drawings.

Figure 1:
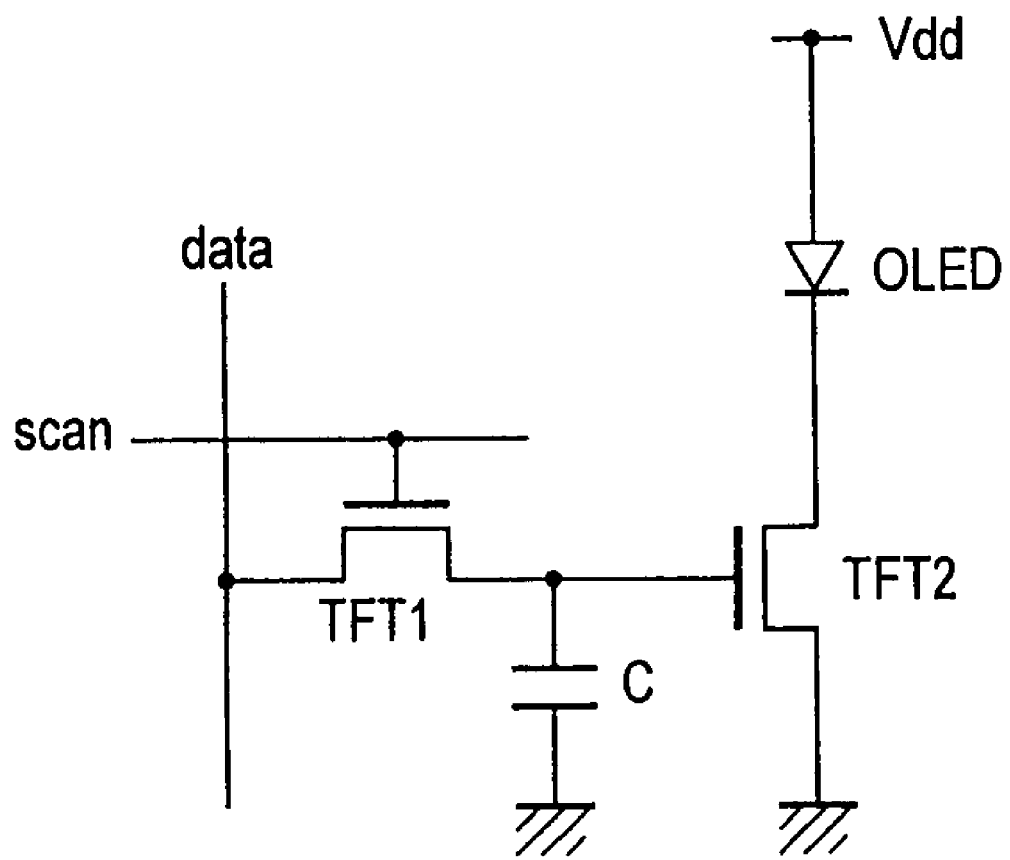
FIG. 1 is a circuit diagram of an example of a conventional pixel circuit.
Figure 2:
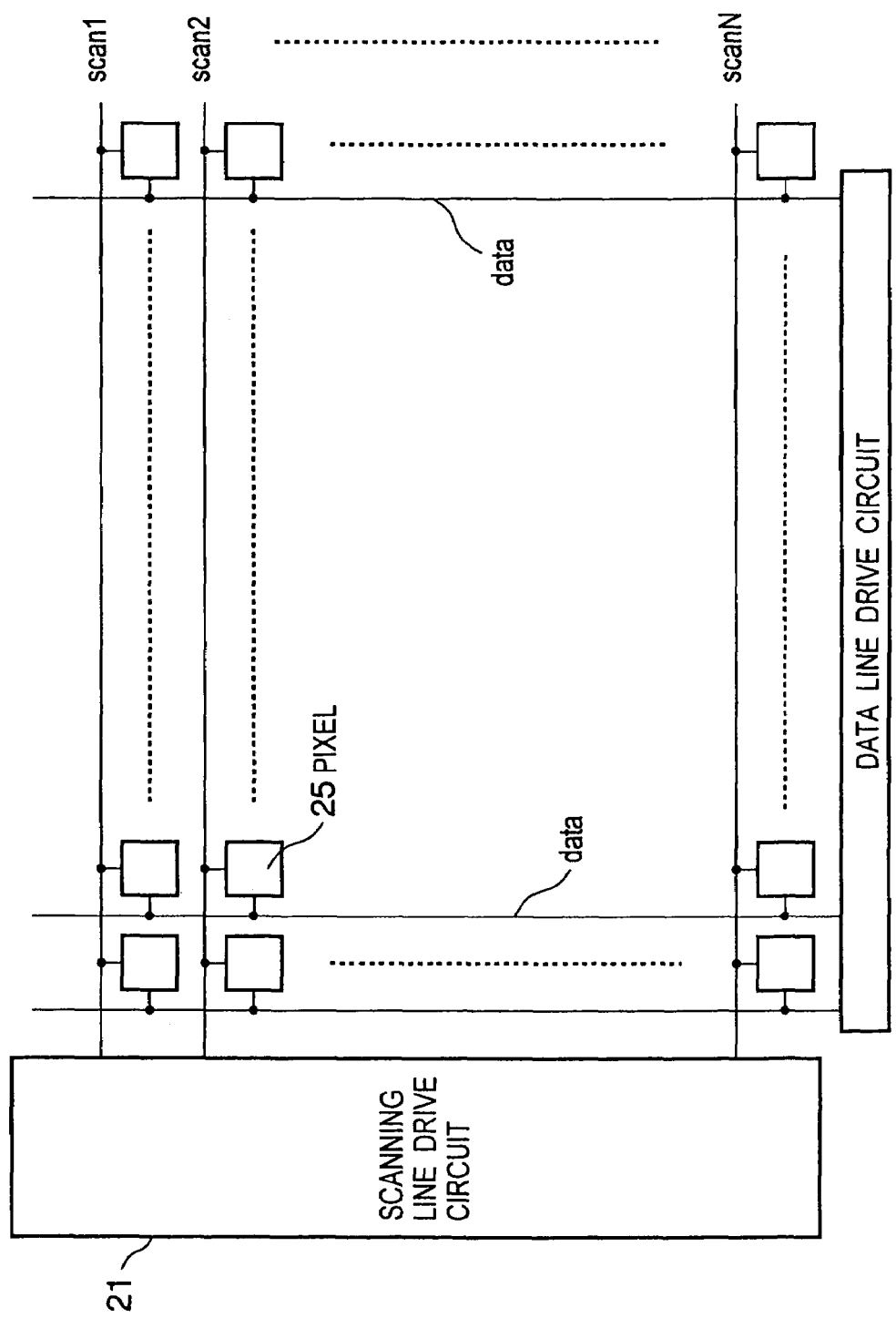
FIG. 2 is a block diagram of an example of the configuration of a conventional display device.
Figure 3:
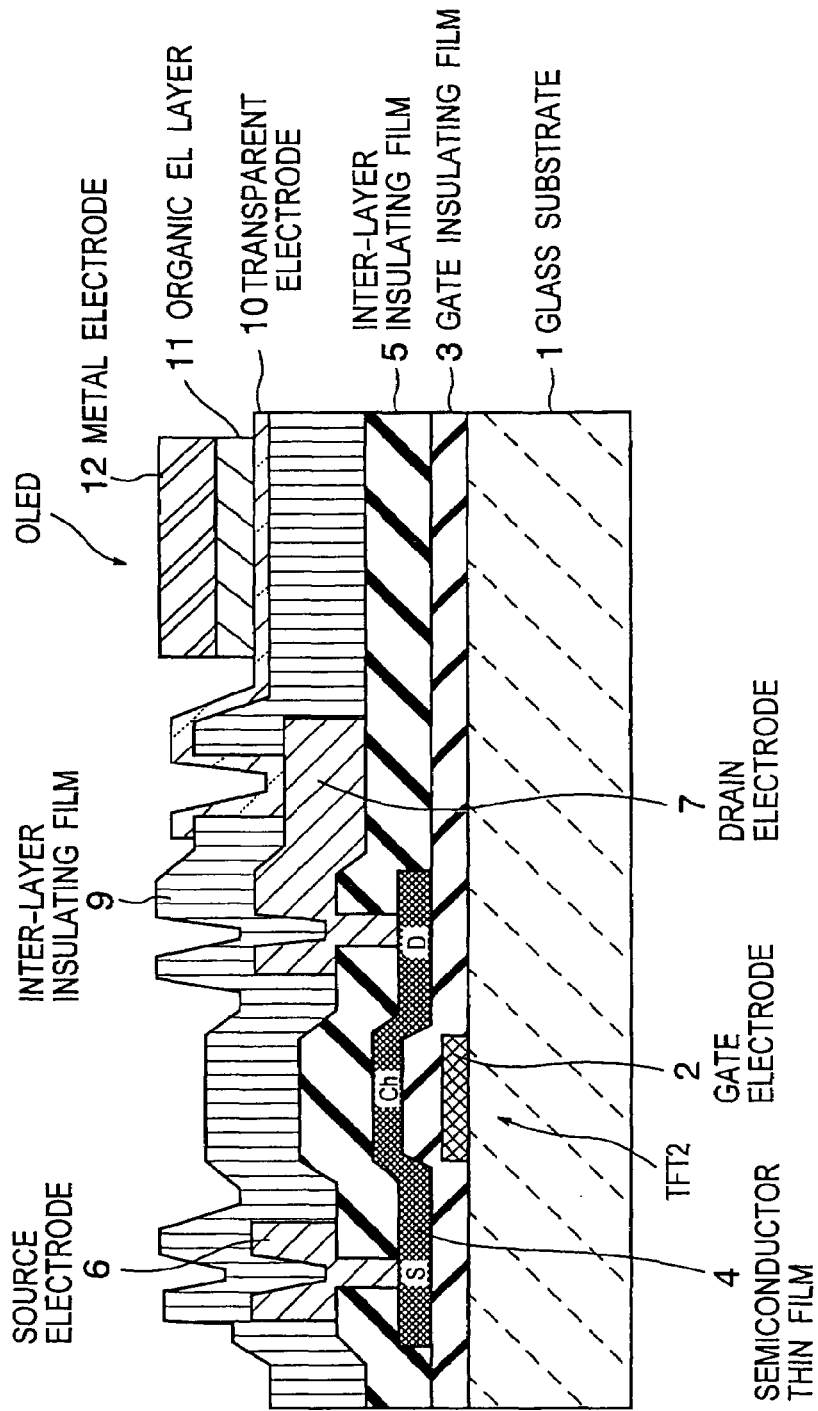
FIG. 3 is a sectional view of an example of the configuration of a conventional display device.
Figure 4:
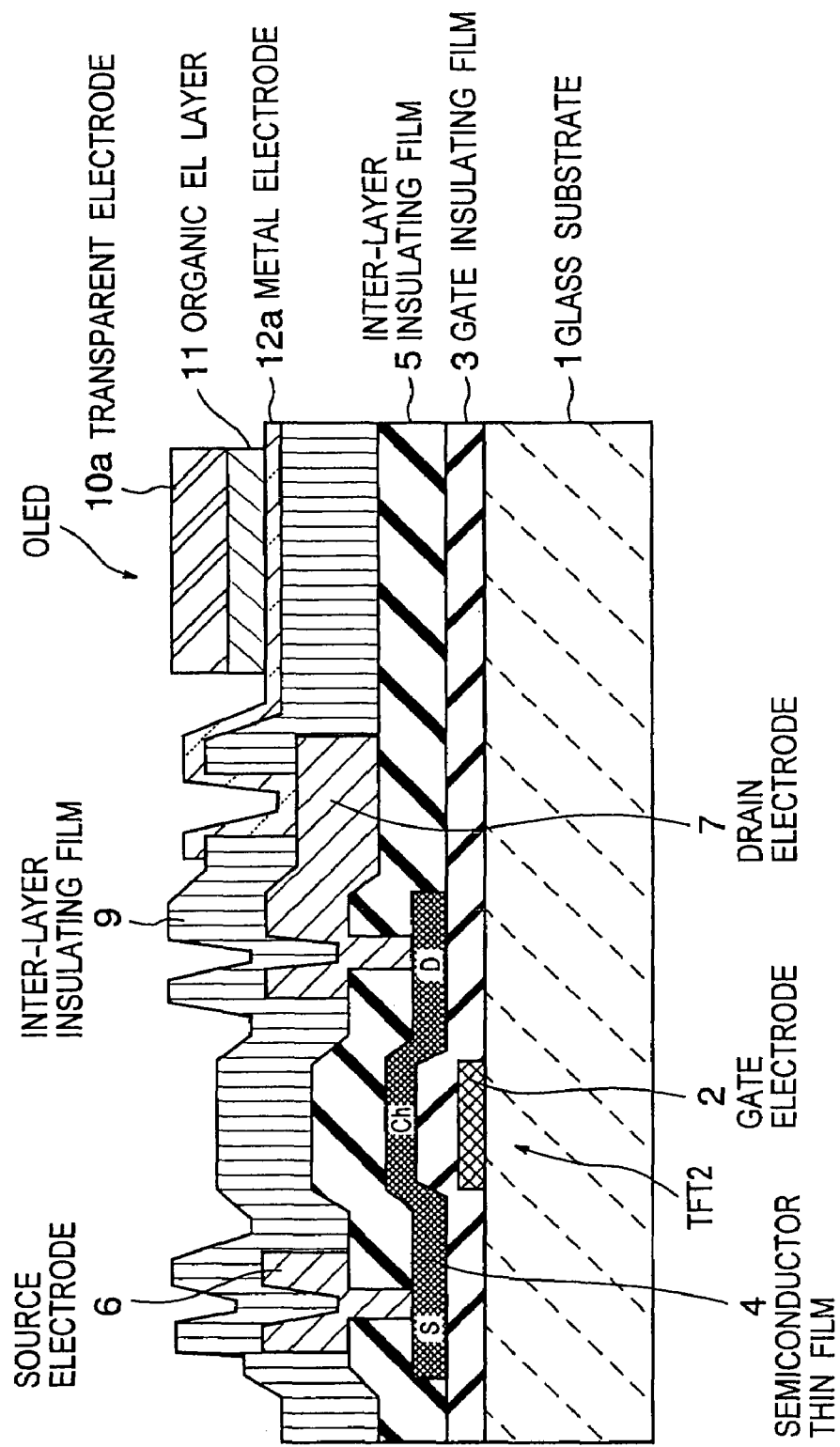
FIG. 4 is a sectional view of another example of the configuration of a conventional display device.
Figure 5:
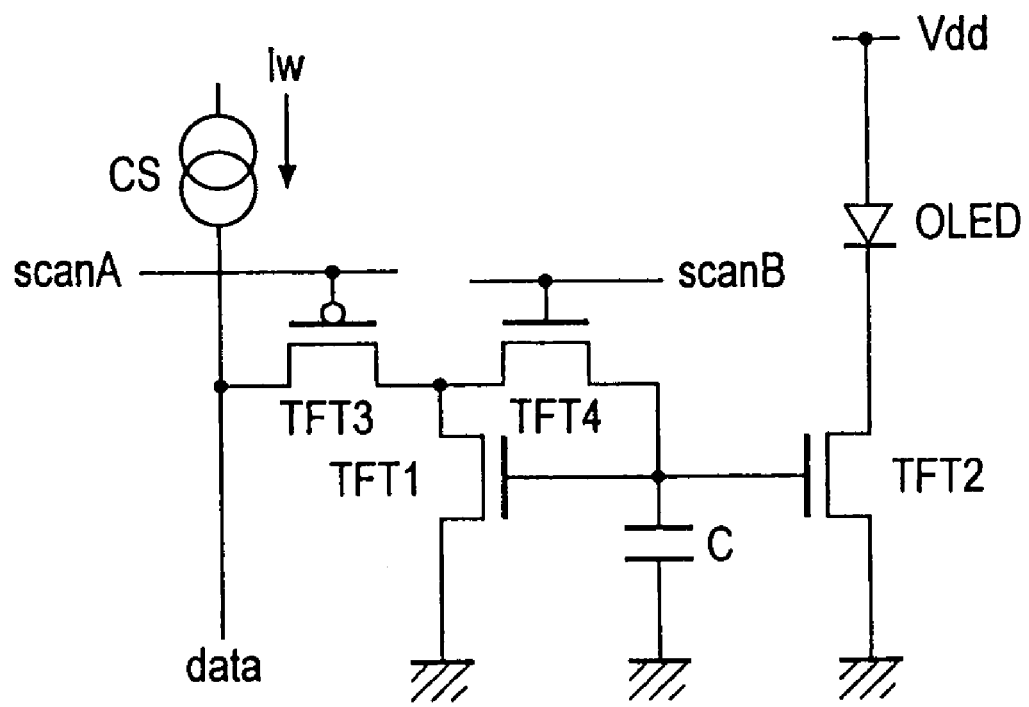
FIG. 5 is a circuit diagram of an embodiment of a pixel circuit according to the present invention.

FIG. 5 shows an example of a pixel circuit according to the present invention. This circuit comprises, other than the conversion use transistor TFT1 with the signal current flowing therethrough and the drive use transistor TFT2 for controlling the drive current flowing through a light emitting element made of an organic EL element or the like, a fetch use transistor TFT3 for connecting or disconnecting the pixel circuit and the data line DATA by the control of a first scanning line SCAN-A, a switch use transistor TFT4 for short-circuiting the gate and the drain of the TFT1 during the writing period by the control of a second scanning line SCAN-B, a capacitor C for holding the voltage between the gate and source of the TFT1 even after the end of the writing, and the light emitting element OLED. In FIG. 5, TFT3 is configured by a PMOS, and the other transistors are configured by NMOSs, but this is one example. The invention does not always have to be this way. The capacitor C is connected to the gate of the TFT1 at its one terminal, and connected to the GND (ground potential) at its other terminal, but this is not limited to GND. Any constant potential is possible. The anode of the OLED is connected to the positive power supply potential Vdd.

Basically, the display device according to the present invention is provided with a scanning line drive circuit for successively selecting scanning lines SCAN-A and SCAN-B, a data line drive circuit including a current source CS for generating a signal current Iw having a current level in accordance with the brightness information and successively supplying the same to the data lines DATA, and a plurality of pixels arranged at intersecting portions of the scanning lines SCAN-A and SCAN-B and data lines DATA and including current drive type light emitting elements OLED emitting light by receiving the supply of the drive current. As the characterizing feature, each pixel shown in FIG. 5 comprises a receiving part for fetching the signal current Iw from the data line DATA when the scanning line SCAN-A is selected, a converting part for once converting the current level of the fetched signal current Iw to the voltage level and holding the same, and a drive part for passing the drive current having the current level in accordance with the held voltage level through the light emitting element OLED. Specifically, the converting part includes a conversion use thin film transistor TFT1 provided with a gate, source, drain, and channel and the capacitor C connected to the gate. The conversion use thin film transistor TFT1 generates a converted voltage level at the gate by passing the signal current Iw fetched by the receiving part through the channel, while the capacitor C holds the voltage level created at the gate.

Further, the converting part includes the switch use thin film transistor TFT4 inserted between the drain and gate of the conversion use thin film transistor TFT1. The switch use thin film transistor TFT4 becomes conductive when converting the current level of the signal current Iw to the voltage level, electrically connects the drain and gate of the conversion use thin film transistor TFT1, and creates the voltage level with reference to the source at the gate of the TFT1. Further, the switch use thin film transistor TFT4 is cut off when the capacitor C holds the voltage level and separates the gate of the conversion use thin film transistor TFT1 and the capacitor C connected to this from the drain of the TFT1.

Further, the drive part includes a drive use thin film transistor TFT2 provided with a gate, drain, source, and channel. The drive use thin film transistor TFT2 receives the voltage level held at the capacitor C at its gate and passes a drive current having a current level in accordance with that via the channel to the light emitting element OLED. A current mirror circuit is configured by direct connection of the gate of the conversion use thin film transistor TFT1 and the gate of the drive use thin film transistor TFT2, whereby a proportional relationship is exhibited between the current level of the signal current Iw and the current level of the drive current. The drive use thin film transistor TFT2 is formed in the vicinity of the corresponding conversion use thin film transistor TFT1 inside the pixel and has an equivalent threshold voltage to that of the conversion use thin film transistor TFT1. The drive use thin film transistor TFT2 operates in the saturated region and passes a drive current in accordance with the difference between the level of the voltage applied to the gate thereof and the threshold voltage to the light emitting element OLED.

Figure 6:
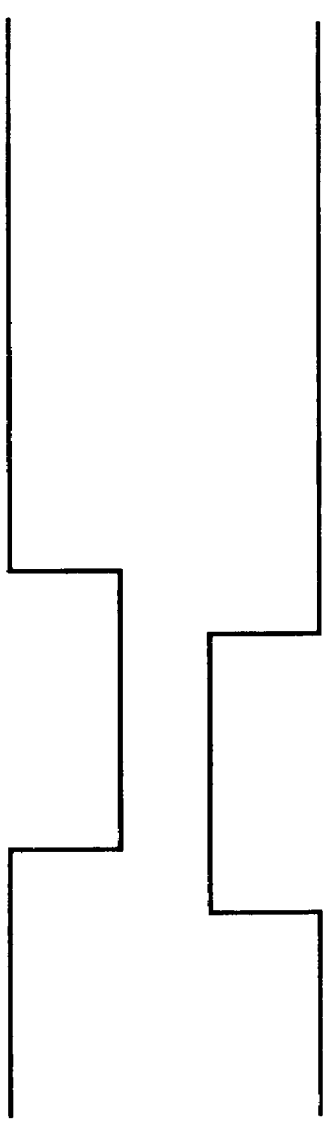
FIGS. 6A, 6B, 6C and 6D are waveform diagrams of an example of waveforms of signals in the embodiment of FIG. 5.

The driving method of the present pixel circuit is as follows. The drive waveforms are shown in FIG. 6. First, at the time of writing, the first scanning line SCAN-A and the second scanning line SCAN-B are brought into the selected state. In the example of FIG. 6, the first scanning line SCAN-A is set at a low level, and the second scanning line SCAN-B is set at a high level. By connecting the current source CS to the data line DATA in a state where both scanning lines are selected, the signal current Iw in accordance with the brightness information flows through the TFT1. The current source CS is a variable current source controlled in accordance with the brightness information. At this time, the gate and the drain of the TFT1 are short-circuited by the TFT4, and therefore equation (5) stands, and the TFT1 operates in the saturated region. Accordingly, between the gate and the source thereof, a voltage Vgs given by equation (3) is created. Next, the first scanning line SCAN-A and the second scanning line SCAN-B are brought to the unselected state. In more detail, first the second scanning line SCAN-B is set at a low level and the TFT4 is brought into an off state. By this, Vgs is held by the capacity C. Next, by setting the first scanning line SCAN-A at a high level and bringing it to the off state, the pixel circuit and the data line DATA are electrically cut off, and therefore, the writing to the other pixel can be carried out via the data line DATA thereafter. Here, the data output by the current source CS as the current level of the signal current must be effective at the point of time when the second scanning line SCAN-B becomes unselected, but after that, may be set at any level (for example the write data of the next pixel). The gate and the source of the TFT2 are commonly connected together with the TFT1. Further, the two are formed close inside a small pixel. Therefore, if the TFT2 operates in the saturated region, the current flowing through the TFT2 is given by equation (4). This becomes the drive current Idrv flowing through the light emitting element OLED. In order to operate the TFT2 in the saturated region, a sufficient positive potential may be given to the Vdd so that equation (5) still stands even if a voltage drop at the light emitting element OLED is considered.

According to the above drive, the current Idrv flowing through the light emitting element OLED is given by the previous equation (6):

$$Idrv=(W2/L2)/(W1/L1)\cdot Iw$$

and a value correctly proportional to Iw without being affected by variations in the characteristics of the TFT is obtained. The proportional constant (W2/L2)/(W1/L1) can be set to a proper value by considering various circumstances. For example, where assuming that the value of the current to be passed through the light emitting element OLED of one pixel is a relatively small value, for example 10 nA, as the actual problem, it is sometimes difficult to correctly supply such a small current value as the signal current Iw. In such a case, if a design is made so that (W2/L2)/(W1/L1)=1/100 stands, Iw becomes 1 µA from equation (6) and the current write operation becomes easy.

In the above example, it was assumed that the TFT2 operated in the saturated region, but the present invention is effective even in the case where the TFT2 operates in the linear region as mentioned before. Namely, where the TFT2 operates in the linear region, the current Idrv flowing through the light emitting element OLED is given by the above equation (8):

$$Idrv=\mu 2\cdot Cox2\cdot W2/L2*\{(2Iw\cdot L1/\mu 1\cdot Cox1\cdot W1)^{1/2}Vds2-Vds2^{\ 2}/2\}$$

In the above equation, Vds2 is determined by current-voltage characteristics of the light emitting element OLED and the current Idrv flowing through the light emitting element OLED. When the potential of Vdd and the characteristics of the light emitting element OLED are given, it is a function of only Idrv. In this case, the relationship between Iw and Idrv does not become the simple proportional relationship as in equation (6), but if Iw is given, the Idrv satisfying equation (8) becomes the drive current flowing through the OLED. Vth is not contained in equation (8), therefore it is seen that the relationship between Iw and Idrv is not affected by the variation of Vth (variation for every pixel in the screen or variation for every manufacturing lot). Namely, by writing the predetermined Iw without being affected by variation in the Vth, the intended Idrv can be obtained. In this way, when the TFT2 operates in the linear region, the voltage between the drain and the source of the TFT2 becomes small in comparison with the case where it operates in the saturated region, therefore a low power consumption can be realized.

Figure 7:
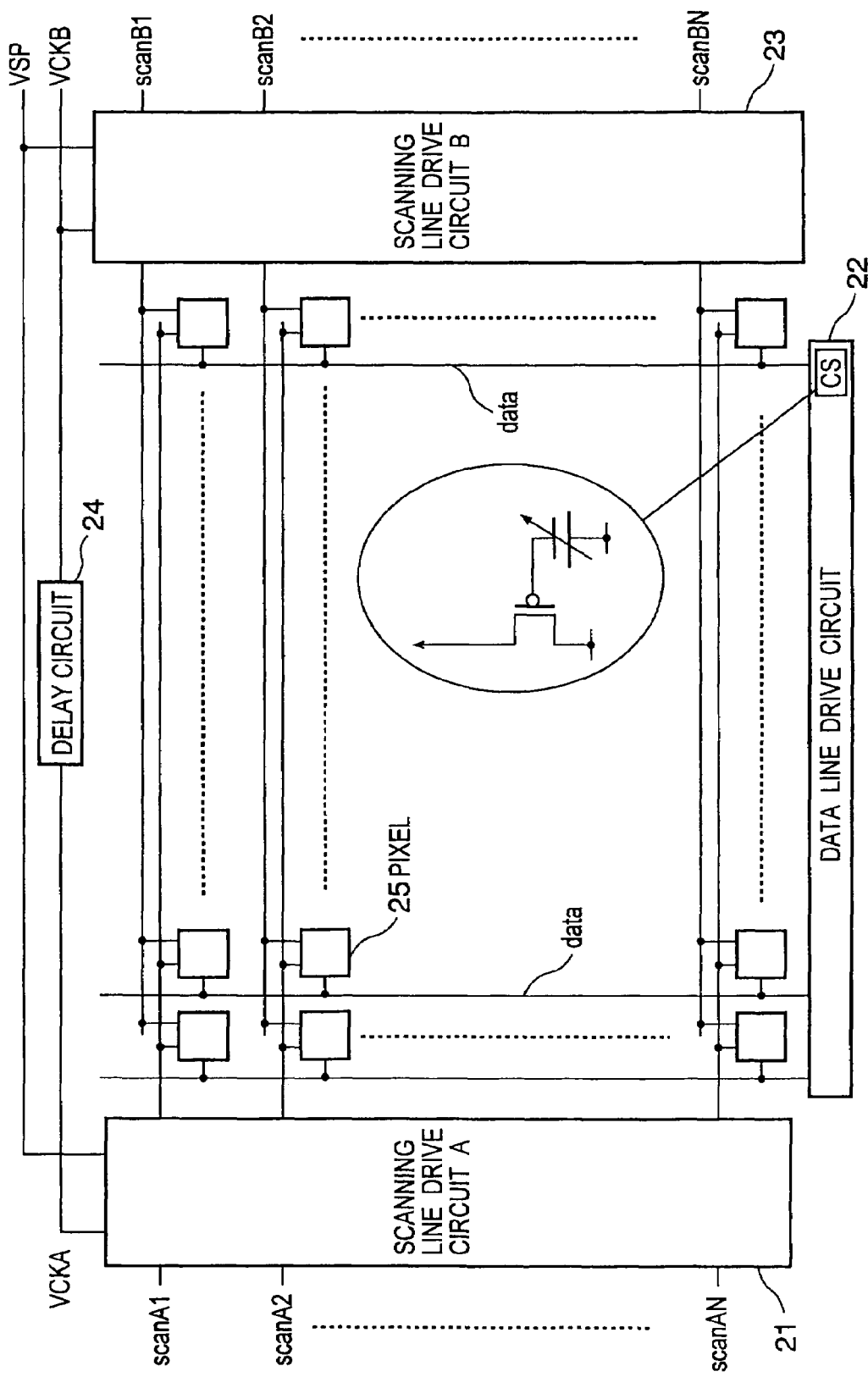
FIG. 7 is a block diagram of an example of the configuration of a display device using a pixel circuit according to the embodiment of FIG. 5.

FIG. 7 shows an example of the display device configured by arranging the pixel circuits of FIG. 5 in the matrix state. The operation thereof will be explained below. First, a vertical start pulse (VSP) is input to a scanning line drive circuit A21 including the shift register and a scanning line drive circuit B23 similarly including the shift register. After receiving VSP, the scanning line drive circuit A21 and scanning line drive circuit B23 successively select first scanning lines SCAN-A1 to SCAN-AN and second scanning lines SCAN-B1 to SCAN-BN synchronous to the vertical clocks (VCKA, VCKB). The current source CS is provided in the data line drive circuit 22 corresponding to each data line DATA and drives the data line at a current level in accordance with the brightness information. The current source CS comprises an illustrated voltage/current conversion circuit and outputs the signal current in accordance with the voltage representing the brightness information. The signal current flows through the pixel on the selected scanning line, and the current is written in units of the scanning lines. Each pixel starts to emit light with an intensity in accordance with its current level. Note, VCKA is slightly delayed relative to VCKB by a delay circuit 24. By this, as shown in FIG. 6, SCAN-B becomes unselected preceding SCAN-A.

Figure 8:
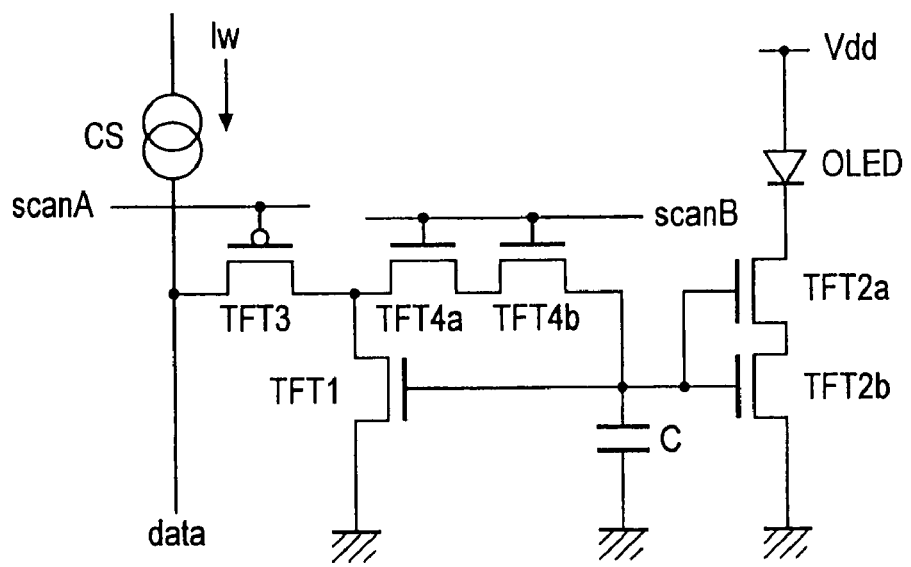
FIG. 8 is a circuit diagram of a modification of the embodiment of FIG. 5.

FIG. 8 is a modification of the pixel circuit of FIG. 5. This circuit gives a double gate configuration wherein two transistors TFT2a and TFT2b are connected in series to the TFT2 in FIG. 5 and imparts a double gate configuration wherein two transistors TFT4a and TFT4b are connected in series to the TFT4 in FIG. 5. The gates of the TFT2a and TFT2b and the gates of the TFT4a and TFT4b are commonly connected, therefore basically they perform a similar operation to that of single transistors. As a result, also the pixel circuit of FIG. 8 performs a similar operation to that of the pixel circuit of FIG. 5. With a single transistor, particularly TFT, there is a case where the leakage current at the off time becomes large according to a certain defect or the like. For this reason, when it is intended to suppress the leakage current, preferably a redundant configuration of connecting a plurality of transistors in series is employed. This is because, when employing this, even if there is a leakage in one transistor, if the leakage of the other transistor is small, the leakage as a whole can be suppressed. When employing the configuration such as TFT2a and TFT2b of FIG. 8, due to the small leakage current, there arises a merit that the quality of the black level of the display becomes good when the brightness is zero (current zero). Further, when employing the configuration such as TFT4a and TFT4b, there arises a merit that the brightness information written in the capacitor C can be stably held. For these, similarly, it is also possible to configure three or more transistors in series. As described above, in the present modification, the receiving part, converting part, and the drive part configure the current circuit combining a plurality of thin film transistors TFT. One or more thin film transistors (TFT) have the double gate structure for suppressing the current leakage in the current circuit.

Figure 9:
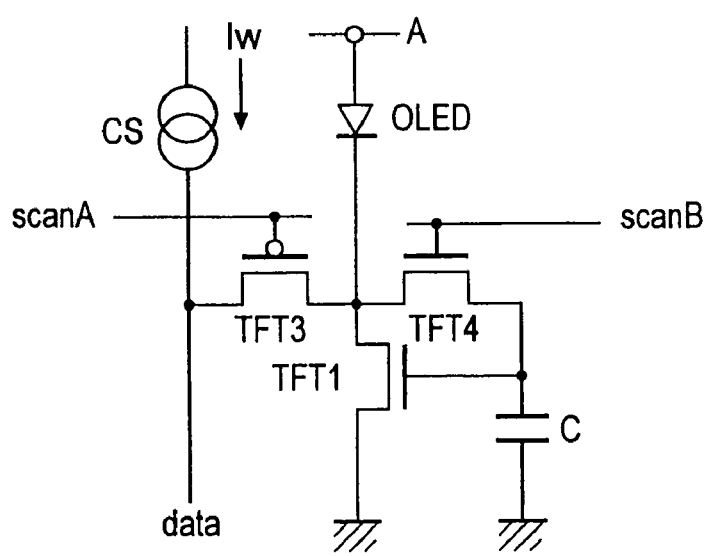
FIG. 9 is a circuit diagram of another embodiment of a pixel circuit according to the present invention.

FIG. 9 shows another embodiment of the pixel circuit according to the present invention. The characterizing feature of this circuit resides in that the transistor TFT1 with the signal current Iw flowing therethrough per se controls the current Idrv flowing through the light emitting element OLED. In the pixel circuit shown in FIG. 5 mentioned before, when the characteristics of TFT1 and TFT2 (Vth, µ or the like) are slightly different from each other, equation (6) does not correctly stand, and there is a possibility such that Iw and Idrv are not correctly proportional, but in the pixel circuit of FIG. 9, such a problem does not occur in principle. The pixel circuit of FIG. 9 is provided with, other than the TFT1, a transistor TFT3 for connecting or disconnecting the pixel circuit and the data line DATA by the control of the first scanning line SCAN-A, a transistor TFT4 for short-circuiting the gate and the drain of the TFT1 during the writing period by the control of the second scanning line SCAN-B, a capacitor C for holding the voltage between the gate and source of the TFT1 even after the end of the writing, and a light emitting element OLED made of the organic EL element. The holding capacitor C is connected to the gate of the TFT1 at its one terminal and connected to the GND (ground potential) at its other terminal, but this is not limited to GND. Any constant potential is possible. The anode of the light emitting element OLED is connected to the anode line A arranged in units of the scanning lines. The TFT3 is configured by a PMOS, and the other transistors are configured by NMOSs, but this is one example. The invention does not always have to be this way.

As described above, in the present embodiment, the drive part of the pixel circuit shares the conversion use thin film transistor TFT1 in a time division manner together with the conversion part. Namely, the drive part separates the conversion use thin film transistor TFT1 from the receiving part after completing the conversion of the signal current Iw and uses the same for drive and passes the drive current to the light emitting element OLED through the channel in the state where the held voltage level is applied to the gate of the conversion use thin film transistor TFT1. Further, the drive part has a controlling means for cutting off the unnecessary current flowing through the light emitting element OLED via the conversion use thin film transistor TFT1 at times other than the drive. In the case of the present example, the controlling means controls the voltage between terminals of the two terminal type light emitting elements OLED having the rectification function by the anode line A and cuts off the unnecessary current.

Figure 10:
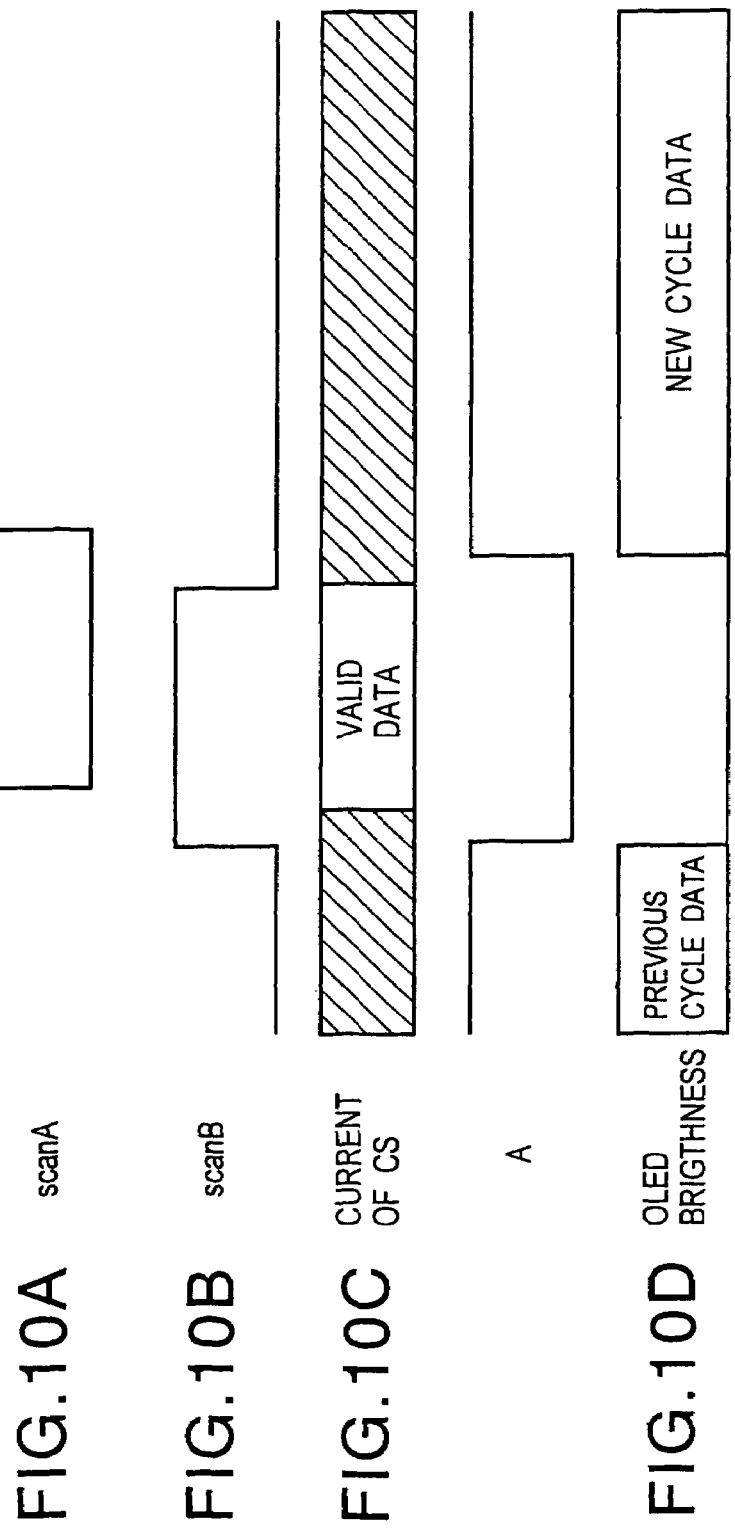
FIGS. 10A, 10B, 10C and 10D are waveform diagrams of an example of waveforms of signals in the embodiment of FIG. 9.

The driving method of this circuit is as follows. The drive waveform is shown in FIG. 10. First, the first scanning line SCAN-A and the second scanning line SCAN-B are brought to the selected state at the time of writing. In the example of FIG. 10, the first scanning line SCAN-A is set at a low level, and the second scanning line SCAN-B is set at a high level. Here, the current source CS of the current value Iw is connected to the data line DATA, but in order to prevent the Iw from flowing via the light emitting element OLED, the anode line A of the light emitting element OLED is set at low level (for example GND or negative potential) so that the light emitting element OLED becomes the off state. By this, the signal current Iw flows through the TFT1. At this time, the gate and the drain of the TFT1 are electrically short-circuited by the TFT4, therefore equation (5) stands, and the TFT1 operates in the saturated region. Accordingly, the voltage Vgs given by equation (3) is created between the gate and the source thereof. Next, the first scanning line SCAN-A and the second scanning line SCAN-B are brought to the unselected state. In more detail, first, the second scanning line SCAN-B is brought to the low level and the TFT4 is brought to the off state. By this, the Vgs created in the TFT1 is held at the capacity C. Next, by setting the SCAN-A at the high level and bringing the TFT3 to the off state, the pixel circuit and the data line DATA are electrically cut off, and therefore the writing to another pixel can be carried out via the data line DATA after that. Here, the data supplied by the current source CS as the signal current Iw must be valid at a point of time when the second scanning line SCAN-B becomes unselected, but may be set at any value (for example write data of the next pixel) after that. Then, the anode line A is brought to the high level. The Vgs of the TFT1 is held by the capacitor C, therefore if the TFT1 operates in the saturated region, the current flowing through the TFT1 coincides with Iw in equation (3). This becomes the drive current Idrv flowing through the light emitting element OLED. That is, the signal current Iw coincides with the drive current Idrv of the light emitting element OLED. In order to operate the TFT1 in the saturated region, a sufficient positive potential may be given to the anode line A so that equation (5) still stands even if the voltage drop at the light emitting element OLED is considered. According to the above drive, the current Idrv flowing through the light emitting element OLED correctly coincides with Iw without being affected by variations in the characteristics of the TFT.

Figure 11:
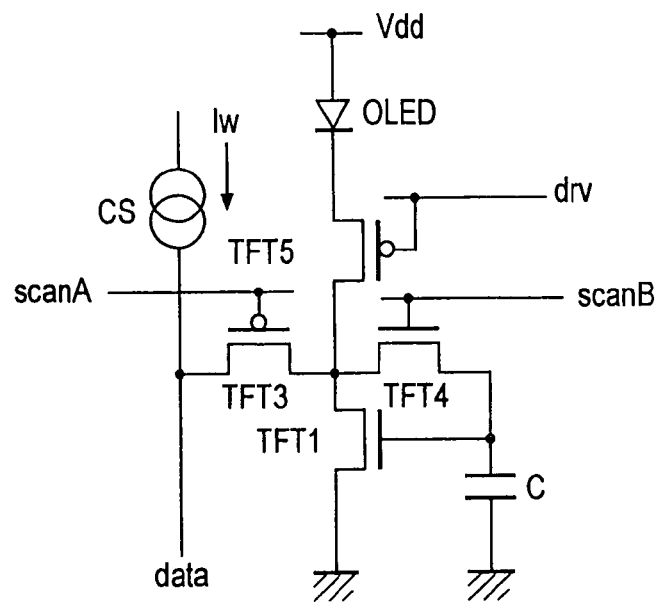
FIG. 11 is a circuit diagram of a modification of the embodiment of FIG. 9.

FIG. 11 is a modification of the pixel circuit shown in FIG. 9. In FIG. 11, there is no anode line as in FIG. 9. The anode of the light emitting element OLED is connected to the constant positive potential Vdd, while a P-channel transistor TFT5 is inserted between the drain of the TFT1 and the cathode of the light emitting element OLED. The gate of the TFT5 is controlled by the drive line drv arranged in units of the scanning lines. The object of insertion of TFT5 is prevention of the flow of the signal current Iw via the light emitting element OLED by setting the drive line drv at a high level and bringing the TFT5 to the off state at the time of writing data. After the writing is ended, the drv is brought to the low level, the TFT5 is brought to the on state, and the drive current Idrv flows through the light emitting element OLED. The rest of the operation is similar to that of the circuit of FIG. 9.

The present example includes the TFT5 connected to the light emitting element OLED in series and can cut off the current flowing to the light emitting element OLED in accordance with the control signal given to the TFT5. The control signal is given to the gate of the TFT5 included in each pixel on the identical scanning line via the drive line drv provided in parallel to the scanning line SCAN. In the present example, the TFT5 is inserted between the light emitting element OLED and the TFT1, and the current flowing through the light emitting element OLED can be turned on or off by the control of the gate potential of the TFT5. According to the present example, the emission of light of each pixel is achieved for the amount of time where the TFT5 is on by a light emission control signal. When defining the on time as τ and the time of one frame as T, the ratio in time when the pixel is emitting light, that is, the duty, becomes approximately τ/T. A time average brightness of the light emitting element changes in proportional to this duty. Accordingly, by changing the on time τ by controlling the TFT5, it is also possible to variably adjust the screen brightness of the EL display conveniently and in a wide range.

As described above, in the present example, the controlling means comprises the control use thin film transistor TFT5 inserted between the conversion use thin film transistor TFT1 and the light emitting element OLED. The control use thin film transistor TFT5 becomes nonconductive and separates the conversion use thin film transistor TFT1 and the light emitting element OLED when the light emitting element OLED is not driven and switches to the conductive state at the time of drive. Further, this controlling means can control the brightness of each pixel by controlling the ratio between the off time for which the drive current is cut off and the light emitting element OLED is placed in the non-light emitting state when the OLED is not to be driven and the on time for which the drive current is passed and the light emitting element OLED is placed in the light emitting state when the OLED is to be driven. According to the present example, before the brightness information of the next scanning line cycle (frame) is newly written after writing the brightness information into the pixels in units of the scanning lines, the display device can extinguish the light emitting elements contained in the pixels in units of the scanning lines together. This means that the time from the lighting to the extinguishing of the light emitting elements after the writing of the brightness information can be adjusted. Namely, it means that the ratio (duty) of the light emitting time in one scanning line cycle can be adjusted. The adjustment of the light emitting time (duty) corresponds to the adjustment of the drive current supplied to each light emitting element. Accordingly, it is possible to adjust the display brightness conveniently and freely by adjusting the duty. A further important point resides in that the drive current can be equivalently made large by adequately setting the duty. For example, when the duty is set at 1/10, even if the drive current is increased to 10 times, an equivalent brightness is obtained. If the drive current is made 10 times large, also the signal current corresponding to this can be made 10 times larger, and therefore it is not necessary to handle a weak current level.

Figure 12:
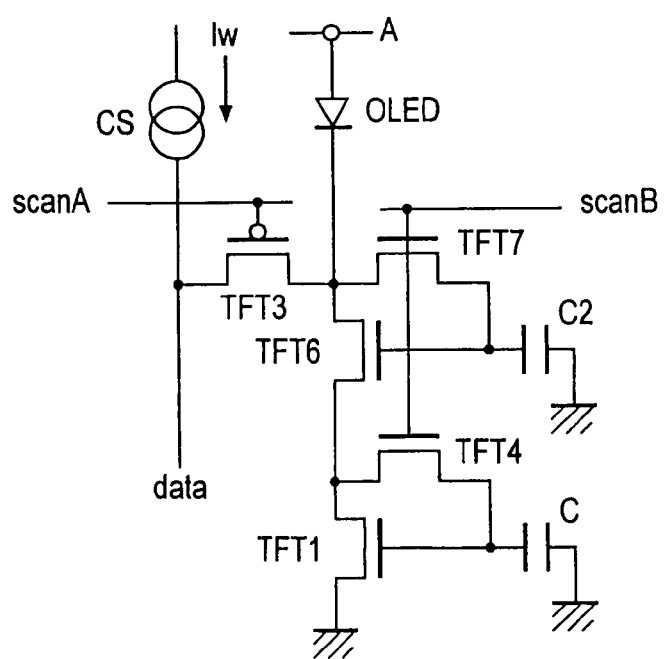
FIG. 12 is a circuit diagram of a modification of the embodiment of FIG. 9.

FIG. 12 is another modification of the pixel circuit shown in FIG. 9. In FIG. 12, a TFT6 is inserted between the drain of the TFT1 and the cathode of the light emitting element OLED, a TFT7 is connected between the gate and the drain of the TFT6, and the gate thereof is controlled by the second scanning line SCAN-B. An auxiliary capacity C2 is connected between the source of the TFT7 and the GND potential. The driving method of this circuit is basically the same as the case of the pixel circuit of FIG. 9, but will be explained below. Note that, the drive waveform is similar to that of the case of FIG. 10. First, at the time of writing, when the first scanning line SCAN-A and the second scanning line SCAN-B are brought to the selected state in the state where the anode line A arranged in units of the scanning lines is brought to the low level (for example GND or negative potential) and the current is prevented from flowing through the OLED, the signal current Iw flows through the TFT1 and TFT6. Since the gates and the sources are short-circuited by the TFT4 and TFT7, the two TFTs operate in the saturated region. Next, the first scanning line SCAN-A and second scanning line SCAN-B are brought to the unselected state. By this, the Vgs previously created in the TFT1 and the TFT6 are held by the capacitor C and the auxiliary capacitor C2. Next, by bringing the first scanning line SCAN-A to the off state, the pixel circuit and the data line DATA are electrically cut off, therefore the writing to another pixel can be carried out via the data line DATA after that. Then, the anode line A is set at a high level. Since the Vgs of the TFT1 is held by the capacitor C, if the TFT1 operates in the saturated region, the current flowing through the TFT1 coincides with Iw of equation (3). This becomes the current Idrv flowing through the light emitting element OLED. That is, the signal current Iw coincides with the drive current Idrv of the light emitting element OLED.

Here, an explanation will be made of the function of the TFT6. In the pixel circuit of FIG. 9, as mentioned before, both of the signal current Iw and the drive current of the light emitting element OLED are determined by the TFT1, therefore Iw=Idrv stood by equation (3) and equation (4). Note, this is true when assuming a case where the current Ids flowing through the TFT1 is given by equation (1) in the saturated region, that is, Ids does not depend on the voltage Vds between the drain and the source. Nevertheless, in an actual transistor, even if Vgs is constant, the larger Vds, the larger Ids in a certain case. This is due to the so-called short channel effect where a pinchoff point in the vicinity of the drain moves to the source by an increase of the Vds, and an effective channel length is reduced, or a so-called back gate effect where the potential of the drain exerts an influence upon the channel potential, and the conduction rate of the channel changes, and so on. In this case, the current Ids flowing through the transistor becomes for example as in the following equation.

$$Ids = \mu \cdot Cox \cdot W/L/2(Vgs-Vth)^2 * (1+\lambda \cdot Vds) \quad (9)$$

Accordingly, Ids will depend on Vds. Here, $\lambda$ is a positive constant. In this case, in the circuit of FIG. 9, Iw does not coincide with Idrv unless Vds is not identical between the time of the writing and the time of the drive.

As opposed to this, the operation of the circuit of FIG. 12 will be considered. When paying attention to the operation of the TFT6 of FIG. 12, the drain potential thereof is not generally identical between the time of the writing and the time of the drive. For example, where the drain potential at the time of the drive is higher, the Vds of the TFT6 becomes larger. When inserting this in equation (9), even if Vgs is constant between the time of the writing and the time of the drive, Ids is increased at the time of the drive. In other words, Idrv becomes bigger than Iw, and the two do not coincide. However, the Idrv flows through the TFT1, therefore, in that case, the voltage drop at the TFT1 becomes large and the drain potential thereof (source potential of the TFT6) rises. As a result, Vgs of the TFT6 becomes small. This acts in a direction reducing the Idrv. As a result, the drain potential of the TFT1 (source potential of the TFT6) cannot largely fluctuate. When paying attention to the TFT1, it is seen that Ids does not largely change between the time of the writing and the time of the drive. Namely, Iw and Idrv will coincide with a remarkably high precision. In order to perform this operation better, it is good if the dependency of Ids with respect to Vds is made small in both of the TFT1 and TFT6, therefore desirably both transistors are operated in the saturated region. At the time of writing, the gate and the drain are short-circuited in both of the TFT1 and TFT6. Therefore, regardless of the brightness data written, the two operate in the saturated region. In order to operate them also at the drive, a sufficient positive potential may be given to the anode line A so that the TFT6 still operates in the saturated region even if the voltage drop at the light emitting element OLED is considered. By this drive, the current Idrv flowing through the light emitting element OLED more correctly coincides with the Iw than the embodiment of FIG. 9 without being affected by variations in the characteristics of the TFT. As described above, the drive part of the present example has TFT6, TFT7, and C2 as potential fixing means for fixing the potential of the drain with reference to the source of the conversion use thin film transistor TFT1 for stabilizing the current level of the drive current flowing to the light emitting element OLED through the conversion use thin film transistor TFT1.

Figure 13:
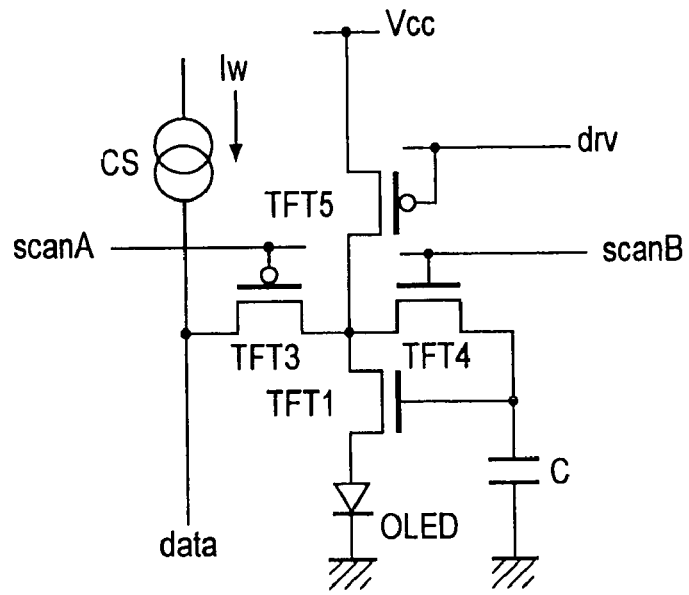
FIG. 13 is a circuit diagram of a modification of the embodiment of FIG. 9.

FIG. 13 is another embodiment of the pixel circuit according to the present invention. The characterizing feature of this pixel circuit resides in that, in the same way as FIG. 9, FIG. 11, and FIG. 12, the transistor TFT1 per se with the signal current Iw flowing therethrough controls the current Idrv flowing through the light emitting element OLED, but in FIG. 13, the light emitting element OLED is connected to the source side of the TFT1. Namely, the drive part of the present pixel circuit includes the thin film transistor TFT1 provided with the gate, drain, and the source and passes the drive current passing between the drain and the source to the light emitting element OLED in accordance with the level of the voltage applied to the gate. The light emitting element OLED is a two-terminal type having an anode and a cathode, and the anode is connected to the source. On the other hand, the drive part of the pixel circuit shown in FIG. 9 includes the thin film transistor provided with the gate, drain, and the source and passes the drive current passing between the drain and the source to the light emitting element in accordance with the level of the voltage applied to the gate. The light emitting element is the two-terminal type having an anode and a cathode, and the cathode is connected to the drain.

The pixel circuit of the present example comprises, other than the TFT1, a transistor TFT3 for connecting or cutting off the pixel circuit and the data line DATA by the control of the first scanning line SCAN-A, a transistor TFT4 for short-circuiting the gate and the drain of the TFT1 during the writing period by the control of the second scanning line SCAN-B, a capacitor C for holding the gate potential of the TFT1 even after the end of the writing, a P-channel transistor TFT5 inserted between the drain of the TFT1 and the power supply potential Vdd, and the light emitting element OLED. In FIG. 13, one terminal of the capacitor C is connected to the GND, and the Vgs of the TFT1 is held at schematically the same value between the time of the writing and the time of the drive. Note that, the gate of the TFT5 is controlled by the drive line drv. The object of the insertion of the TFT5 is to bring the TFT5 into the off state by setting the drive line drv at the high level at the time of writing data and pass all of the signal current Iw through the TFT1. After the writing is ended, the drv is brought to the low level, the TFT5 is brought to the on state, and the drive current Idrv is passed through the light emitting element OLED. In this way, the driving method is similar to that of the circuit of FIG. 11.

Figure 14:
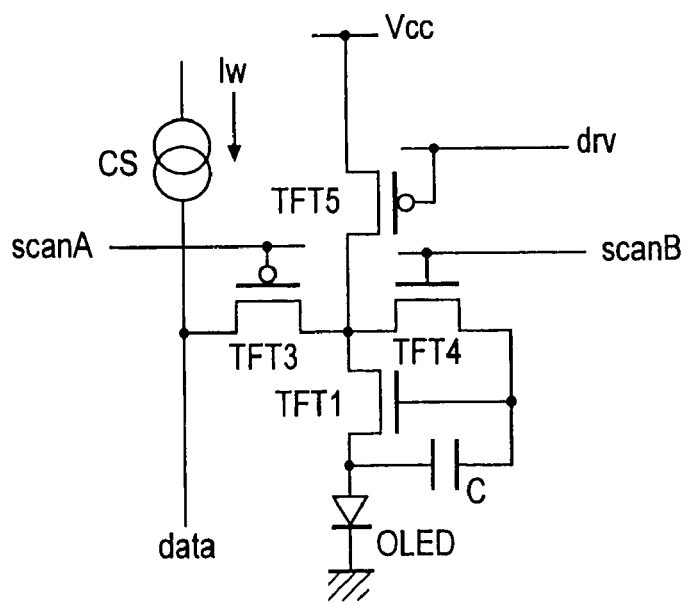
FIG. 14 is a circuit diagram of a modification of the embodiment of FIG. 9.

FIG. 14 is a modification of the pixel circuit shown in FIG. 13. In FIG. 13 and FIG. 14, the difference resides in that one terminal of the capacitor C is connected to the GND in FIG. 13, but is connected to the source of the TFT1 in FIG. 14, but in both cases, there is no functional difference in the point that the Vgs of the TFT1 is held at schematically the same value between the time of the writing and the time of the drive.

Figure 15:
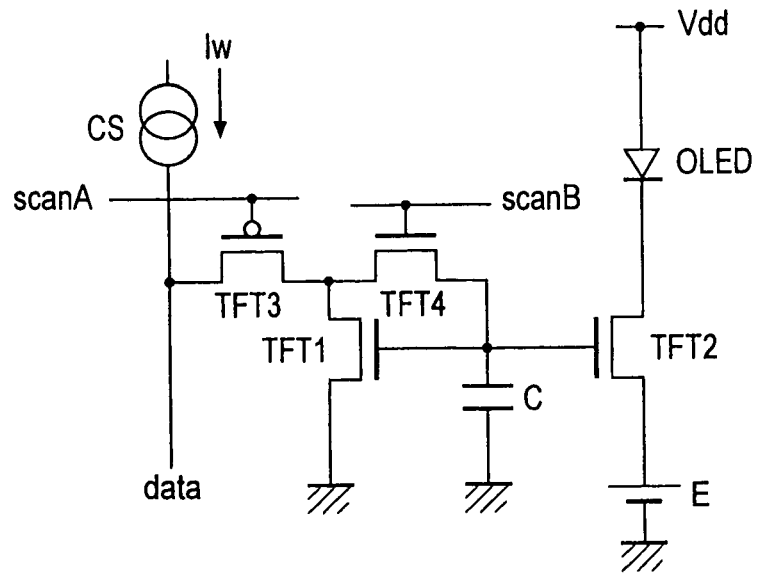
FIG. 15 is a circuit diagram of another embodiment of the pixel circuit according to the present invention.

FIG. 15 is a more developed example of the pixel circuit shown in FIG. 5. The present pixel circuit includes an adjusting means for downwardly adjusting the voltage level held by the converting part and supplying the same to the drive part to tighten the black level of the brightness of each pixel. Concretely, the drive part includes a thin film transistor TFT2 having a gate, drain, and source and an adjusting means provided with a constant voltage source E for raising the bottom of the voltage between the gate and the source of the thin film transistor TFT2 and downwardly adjusting the level of the voltage applied to the gate. Namely, it tightens the black level by connecting the source of the TFT2 to the potential E slightly higher than the source potential of the TFT1.

Figure 16:
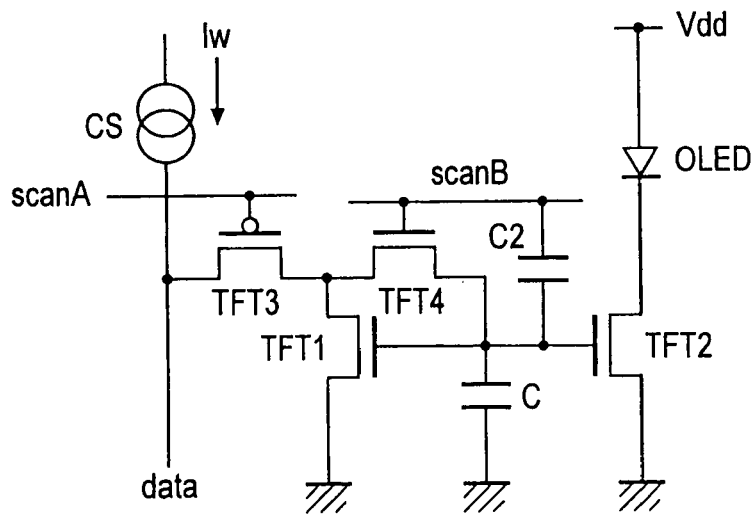
FIG. 16 is a circuit diagram of a modification of the embodiment of FIG. 15.

FIG. 16 is a modification of the pixel circuit shown in FIG. 15. In the present example, the adjusting procedure is comprised by an additional capacitor C2 connected to the gate of the thin film transistor TFT2 and the second scanning line SCAN-B and downwardly adjusts the voltage level to be held at the capacitor C for applying the same to the gate of the thin film transistor TFT2. Namely, when switching the second scanning line SCAN-B to the low level and bringing it to the unselected state, the gate potential of the TFT2 can be slightly lowered by the function of the capacitor C2. As described above, in the present display device, the scanning line SCAN-A for selecting the pixel and the data line DATA giving the brightness information for driving the pixel are arranged in the matrix state. Each pixel includes the light emitting element OLED having the brightness changing according to the amount of the supplied current, the writing means (TFT1, TFT3, C) controlled by the scanning line SCAN-A and writing the brightness information given from the data line DATA to the pixel, and the driving means (TFT2) for controlling the amount of the current supplied to the light emitting element OLED in accordance with the written brightness information. The brightness information is written into each pixel by applying the electric signal Iw in accordance with the brightness information to the data line DATA in the state where the scanning line SCAN A is selected. The brightness information written in each pixel is held at each pixel even after the scanning line SCAN-A becomes unselected. The light emitting element OLED of each pixel includes the adjusting means (C2) capable of maintaining the lighting with the brightness in accordance with the held brightness information, downwardly adjusting the brightness information written by the writing means (TFT1, TFT3, C), and supplying the same to the drive means (TFT2) and can tighten the black level of the brightness of each pixel.

FIG. 17 is a modification of the pixel circuit shown in FIG. 15. In the present example, the adjusting procedure downwardly adjusts the level of the voltage to be applied to the gate of the TFT2 by adjusting the potential of one end of the capacitor C when holding the voltage level converted by the TFT1 at the capacitor C. Namely, by controlling the source potential control line S connected to one end of the capacitor C, the black level is tightened. This is because the gate potential of the TFT2 is slightly lowered by the function of the capacitor C when setting the potential control line S at a lower potential than that at the writing. The potential control line S is provided in units of the scanning lines and, controlled. The potential control line S is brought to an "H" level during the writing and brought to an "L" level after the end of the writing. When defining an amplitude as ΔVs and defining the capacity existing at the gate of the TFT2 (gate capacity, other parasitic capacity) as Cp, the gate potential of the TFT2 is lowered by exactly ΔVg=ΔVs*C/(C+Cp), and Vgs becomes small. The absolute values of the H and L potentials can be freely set.

Figure 18:
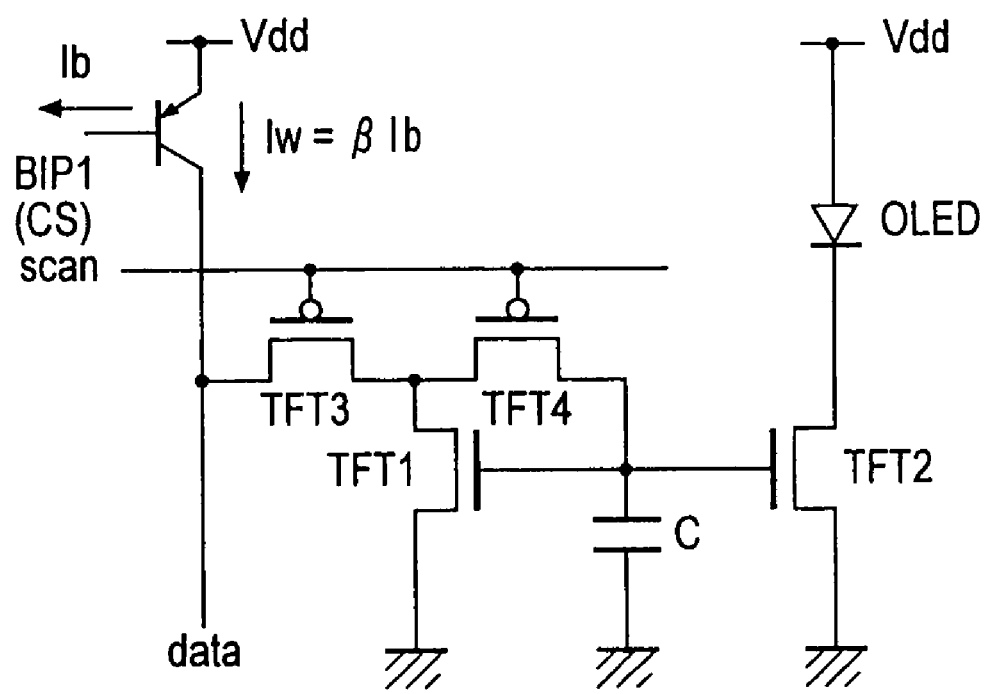
FIG. 18 is a circuit diagram of another embodiment of the pixel circuit according to the present invention.

FIG. 18 is another embodiment of the pixel circuit according to the present invention. In the circuit of the present example, the fetch use thin film transistor TFT3 and the switch use thin film transistor TFT4 are configured as the identical conductivity type (PMOS in FIG. 18). Then, in the present example, as shown in FIG. 18, it is also possible to connect their gates to the common scanning line SCAN in the write operation and control them by the common signal. In the device display in this case, the scanning line drive circuit B23 in the display device shown in FIG. 7 is unnecessary.

Figure 19:
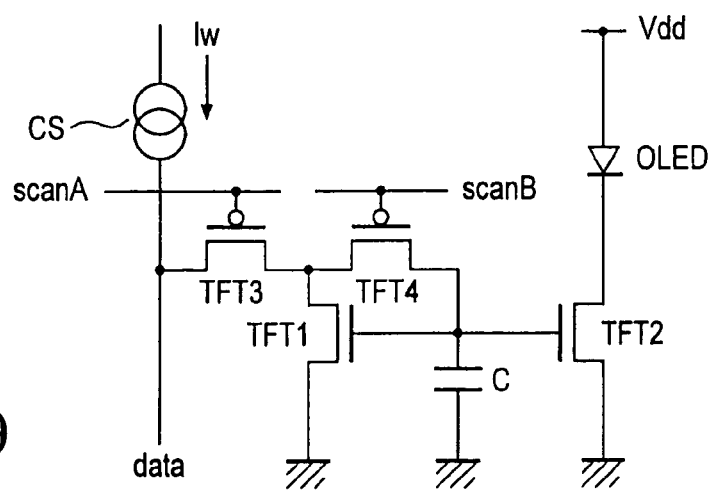
FIG. 19 is a circuit diagram of a modification of the embodiment of FIG. 18.

FIG. 19 is a modification of the pixel circuit shown in FIG. 18. In the present example, in the same way as the circuits shown in FIG. 5, FIG. 8, FIG. 9, and FIG. 11 to FIG. 17, the gates of the fetch use thin film transistor TFT3 and switch use thin film transistor TFT4 configured by the same conductivity type P-channel TFT are connected to different scanning lines, that is, the first scanning line SCAN-A and the second scanning line SCAN-B, and separately controlled. The reason why they are separately controlled in this way is that, if the TFT3 and the TFT4 are controlled by the common signal as in the example of FIG. 18, the following inconvenience sometimes occurs.

When the write operation with respect to the pixel on a certain scanning line is terminated, at the rise of the level of the scanning line SCAN in the example of FIG. 18, the impedance of the TFT3 is inevitably increase and finally actually becomes infinitely large, that is, the off state. Accordingly, in this step, the potential of the data line DATA gradually rises, but at a point of time when it rises to a certain degree, the current source for driving the data line DATA loses the constant current property, and the current value is decreased.

As a concrete example, an example where the data line DATA is driven by a PNP transistor BIP1 as in FIG. 18 is considered. When the current flowing through the base is the constant value Ib and a current amplification rate of a transistor IBIP1 is β, if a certain degree of the voltage (for example 1V) is applied between the collector and the emitter of the transistor BIPI, the transistor BIP1 operates as substantially a constant current source, and a current of a magnitude of Iw=βIb is supplied to the data line DATA. However, at the end of the write operation, when the impedance of the TFT3 rises, the potential of the data line rises, and when the transistor BIP1 enters into the saturated region, it loses the constant current property, and the drive current is decreased from βIb. At this time, if the TFT4 is in the on state, this decreased value of the current flows through the TFT1, and the intended value of the current will not be correctly written.

Accordingly, more desirably the TFT3 and the TFT4 are controlled by the different signal lines, that is, the first scanning line SCAN-A and the second scanning line SCAN-B, and the TFT4 is brought to the off state preceding the TFT3 at the end of the write operation. In the pixel circuit according to the present invention, the TFT3 and the TFT4 do not have to be the same conductivity type as in the examples mentioned before. The pixel circuit may be configured so that the TFT3 and the TFT4 are the identical or different conductivity types, their gates are controlled by the different scanning lines such as the SCAN-A and the SCAN-B, and the TFT4 is brought to the off state preceding the TFT3 at the end of the write operation. This is true also for the examples explained before by referring to the drawings.

Figure 20:
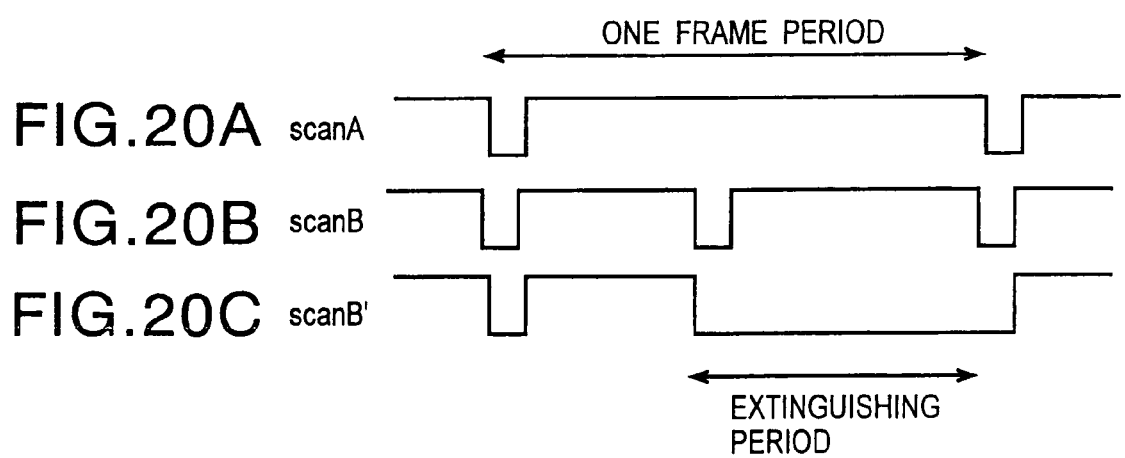
FIGS. 20A, 20B and 20C are views for explaining a case where the pixels are extinguished in units of scanning lines in the circuit of FIG. 19.

Further, when the TFT3 and the TFT4 are controlled by the different scanning lines SCAN-A and SCAN-B, after the end of the write operation, the TFT4 is brought to the on state by the operation of the second scanning line SCAN-B, and the pixels can be extinguished in units of the scanning lines. This is because the gate and the drain of the TFT1 and the gate of the TFT2 are connected, so the gate voltage of the TFT2 becomes the threshold value of the TFT1 (this is almost equal to the threshold value of the TFT2), and both of the TFT1 and TFT2 become the off state. In the waveform of the second SCAN-B, as shown in FIG. 20(B), it is also possible to give a pulse-like extinguishing signal, or it is also possible to give a continuous extinguishing signal as SCAN-B' shown in FIG. 20(C).

In this way, by changing the timing of the extinguishing signal, it is possible to conveniently and freely change the brightness of the display device. If the second scanning line SCAN-B is divided for each of the colors of R, G, and B and they are separately controlled, the color balance can also be easily adjusted.

Further, when it is desired to obtain the same time average brightness, by reducing the ratio of the light emission period (duty), the drive current of the light emitting element OLED can be made large. This means that a write current larger by that amount is handled. Therefore, the realization of the write drive circuit to the data line DATA becomes easy, and also a write required time can be shortened. Further, by reducing the light emission duty to about 50% or less, the moving picture image quality is improved.

Further, in the same way as the circuits shown in FIG. 5, FIG. 8, FIG. 9, and FIG. 11 to FIG. 18, in the circuit of FIG. 19, the fetch use thin film transistor TFT3 and the conversion use thin film transistor TFT1 are configured as different conductivity types. For example, where the conversion use thin film transistor TFT1 is the N-channel type, the fetch use thin film transistor TFT3 is configured as the P-channel type. This is for the following reason.

Namely, desirably the fluctuation of the potential of the data line is as small as possible when configuring the constant current drive circuit for driving the data line. This is because, as mentioned before, if the amount of fluctuation of the data line potential is wide, the constant current property is easily lost in the data line drive circuit. In addition, the amplitude of the scanning line SCAN-A for reliably turning on or off the TFT3 becomes large. This is disadvantageous in the point of the consumed power.

Accordingly, desirably the voltage drop of the route reaching the ground potential from the data line via the TFT3 and the TFT1 is small. Therefore, in contrast to the example of FIG. 19 wherein the TFT1 is an NMOS, the TFT3 is configured by a PMOS, and the voltage drop at the TFT3 is suppressed small. Namely, the voltage drop at the TFT3 becomes the maximum when the value of the write current Iw is the maximum. Therefore, in order to suppress the amplitude of the data line small, the voltage drop at the TFT3 when the write current Iw is the maximum should be made small. In the example of FIG. 19, when the write current Iw is large, the potential of the data line rises in accordance with that, but the absolute value of the voltage between the gate and the source of the TFT3 is increased along with that and the impedance of the TFT3 is lowered. Contrary to this, if the TFT3 is an NMOS, the larger the write current Iw, the smaller the voltage between the gate and the source, the greater the impedance of the TFT3, and the more easily a rise of the data line potential is induced. Similarly, when the TFT1 is configured by a PMOS, the TFT3 is preferably configured by a NMOS.

Note that a practical configuration can be realized whether the conductivity type of the TFT4 is the same as or different from the TFT3, but if the TFT4 is given the same conductivity type as that of the TFT3, the first scanning line SCAN-A and the second scanning line SCAN-B are easily driven by the common potential, so this is more desirable.

Figure 21:
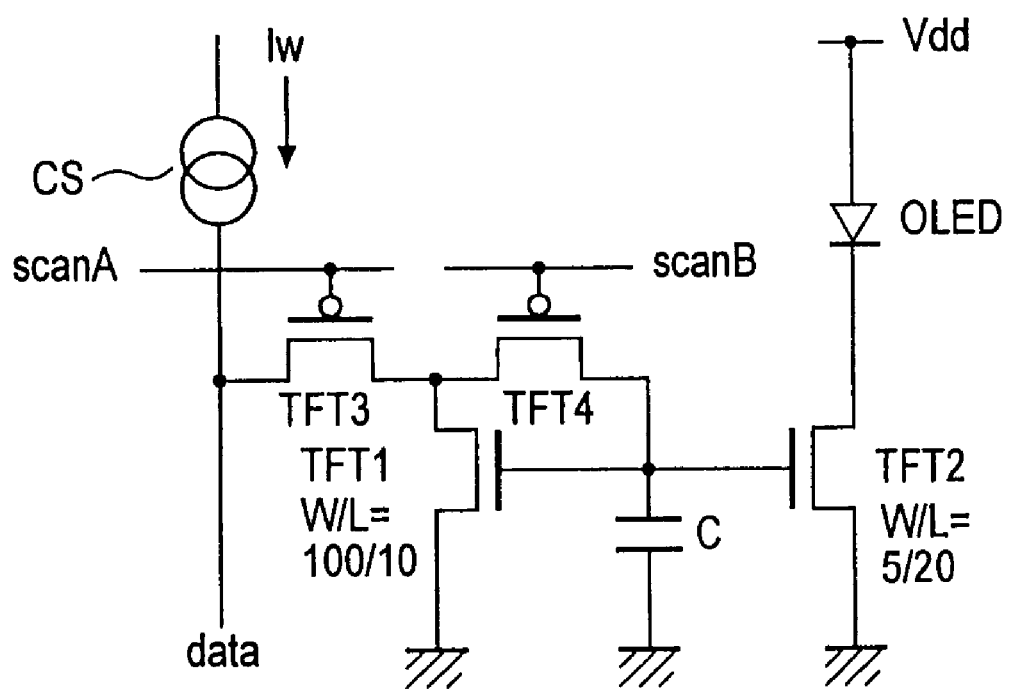
FIG. 21 is a circuit diagram of a modification of the embodiment of FIG. 19.

FIG. 21 is a modification of the pixel circuit shown in FIG. 19. The pixel circuit according to the present example is similar to the pixel circuit shown in FIG. 19 in terms of the equivalent circuit, but it is different from the circuit of FIG. 19 in the point that the ratio W/L between the channel width (W) and the channel length (L) of the conversion use thin film transistor TFT1 is set larger than the W/L of the drive use thin film transistor TFT2. The reason for setting the W/L of the TFT1 larger than the W/L of the TFT2 in this way is for reliably ending the write operation. An explanation will be made of this below by giving specific figures.

As practical numbers, when the maximum brightness is 200 cd/m$^2$, the size of the light emitting surface per pixel is 100 μm×100 μm=1e−8 m$^2$, and the light emission efficiency is 2 cd/A, the drive current of the light emitting element OLED at the maximum brightness becomes 200×1e−8/2=1 μA. When it is intended to control 64 tones, the current value corresponding to the minimum tone becomes about 1 μA/64=16 nA. It is extremely difficult to correctly supply such a small current value. Further, the TFT1 operates in the state of high impedance, therefore a long time is taken for stabilization of the state of the circuit due to an influence of a parasitic capacitance of the data line DATA, etc. The write operation sometimes cannot be terminated within the predetermined scanning line cycle.

As shown in FIG. 21, if W/L of TFT1=100/10 and W/L of TFT2=5/20, the ratio of W/L becomes 40, the write current to be supplied to the data line DATA for obtaining the OLED drive current of 16 nA becomes 16 nA×40=640 nA, which is a practical number, so the write operation can be reliably terminated. When the TFT1 and the TFT2 comprise a plurality of transistors, the above calculation naturally should be carried out by considering an effective W/L.

Figure 22:
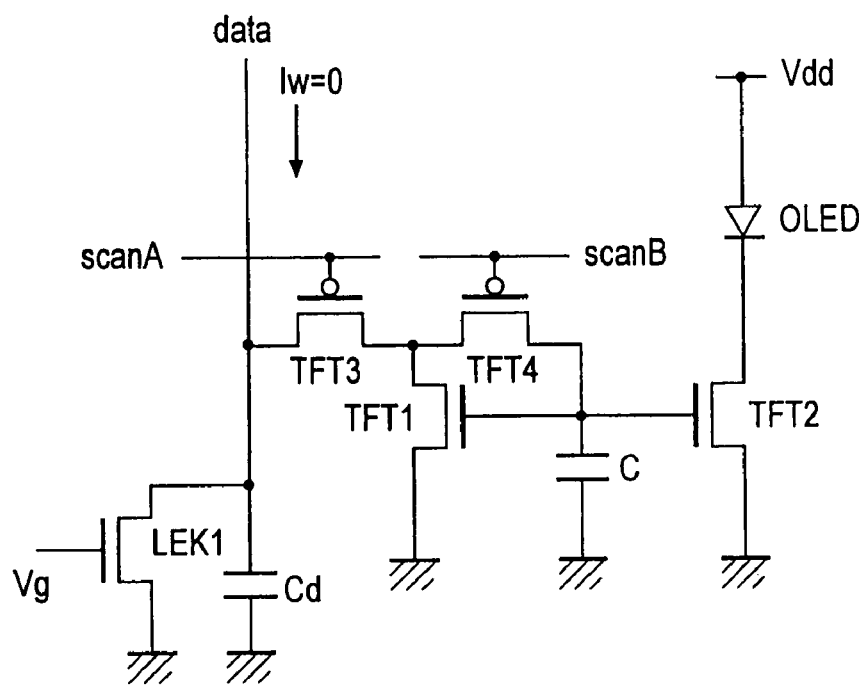
FIG. 22 is a circuit diagram of a modification of the embodiment of FIG. 19.

FIG. 22 is a more developed example of the circuit shown in FIG. 19. In the present pixel circuit, a leak element LEK1 is connected between each data line DATA and the predetermined potential to try to speed up of black writing.

Figure 23:
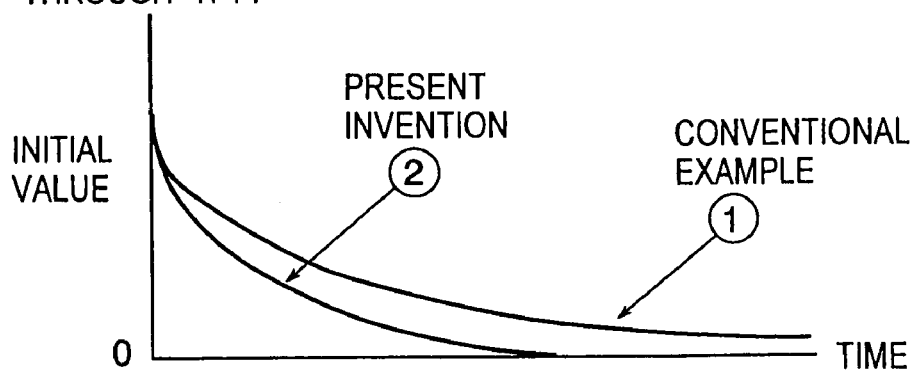
FIG. 23 is a diagram of characteristics of currents flowing through conversion use transistors of the circuit of FIG. 22 and the conventional circuit.

In the current write type pixel circuit, a case of writing "black" corresponds to a case where the write current is zero. At this time, when assuming that a "white" level, that is a relatively large current, is written into the data line in the scanning line cycle immediately before that and as a result the data line potential has become a relatively high level, a long time is necessary for writing "black" immediately after that. The writing of "black" means that initial charges stored in a capacitor Cd etc. of the data line are discharged, but when the data line potential is lowered and becomes in the vicinity of the threshold value of the TFT1, the impedance of the TFT1 becomes high, and as indicated by a characteristic curve <1> in FIG. 23 showing the characteristic of the current flowing through the TFT1, theoretically the "black" writing is permanently not terminated. In actuality, the write operation is carried out in a finite time, therefore this appears as a so-called "black float" phenomenon where the "black" level is not completely achieved. This lowers the contrast of the image.

Therefore, in the circuit of FIG. 22, the leak element LEK1, concretely the NMOS transistor, is connected between the data line DATA and the ground potential GND, and a constant bias is given as Vg. By this, as indicated by a characteristic curve <2> in FIG. 22, the "black" writing is reliably terminated. As the leak element LEK1, also a simple resistor may be used, but in that case, when the data line potential rises at the "white" writing, the current flowing through the resistor is increased in proportion to that, and this induces the lowering of the current flowing through the TFT1 and the degradation of the power consumption. Contrary to this, if an NMOS is operated in the saturated region, a constant current operation is achieved, therefore such a bad influence can be suppressed small. Note that, it is also possible to comprise the leak element by an TFT or comprise the same by an external part separately from the TFT process.

Figure 24:
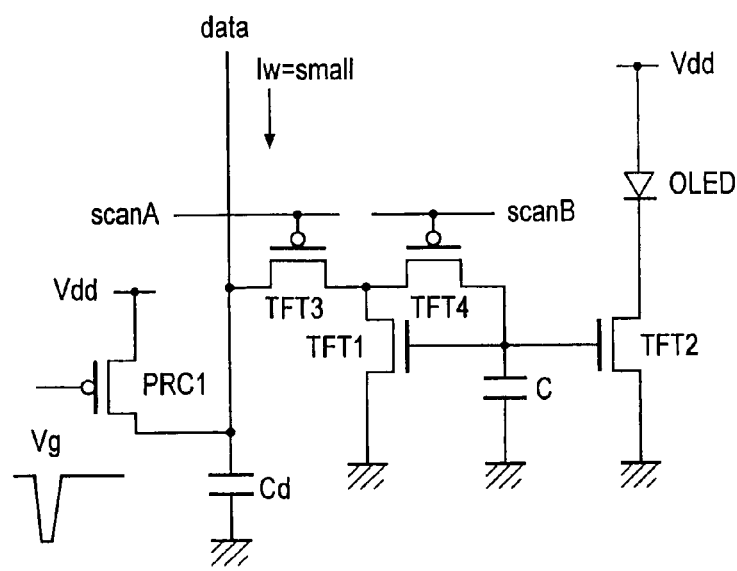
FIG. 24 is a circuit diagram of a modification of the embodiment of FIG. 19.

FIG. 24 is a more developed example of the circuit shown in FIG. 19. In the present pixel circuit, an initial value setting element PRC1 is connected between each data line DATA and the predetermined potential, and the initial value of the data line is set preceding the write operation by the operation of that element to speed up the write operation.

Figure 25:
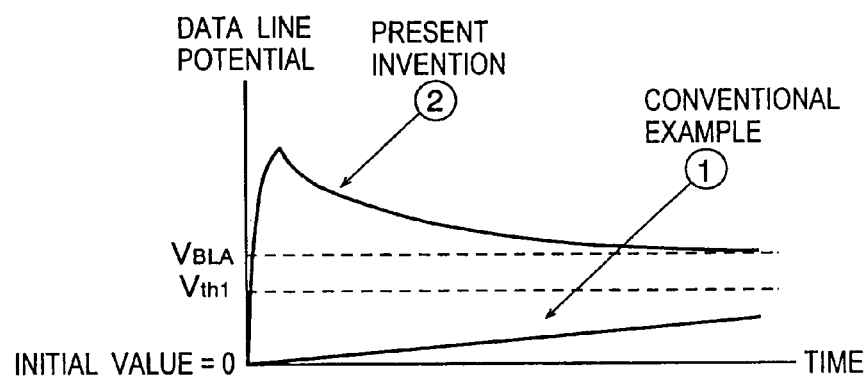
FIG. 25 is a view of data line potentials of the circuit of FIG. 23 and the conventional circuit.

In the current write type pixel, there is a case where a long time is required when writing gray near black. In FIG. 25, a case where the potential of the data line at the start of the write operation is 0V is shown. This can occur in the case where "black" is written in the scanning line cycle immediately before that, the case where the threshold value Vth1 of the TFT1 of the written pixel is low, i.e. about 0V, or similarly the case of the black writing, and the case where the leak element for the countermeasure of black float is provided.

In the conventional circuit, gray near "black", that is, a very small current value, is written from 0V as the initial value, therefore a long time is taken for reaching the balance potential VBLA. For example, as indicated by the characteristic curve <1> in FIG. 25, it can be also considered that the threshold value of the TFT1 is not reached within the predetermined write time, but in this case, the TFT2 also becomes the off state, the gray cannot be correctly written, and the display image exhibits a so-called black crushed state.

In the circuit of FIG. 24, a PMOS transistor is connected between the data line and the power supply potential Vdd as the initial value setting (precharging) element PRC1, and the first pulse is given at the first writing cycle as the gate potential Vg. By this pulse application, as indicated by the characteristic curve <2> in FIG. 25, the data line potential rises to the threshold value Vth1 of the TFT1 or more and converges thereafter at relatively a high speed toward the balance potential VBLA determined by a balance between the write current Iw and the operation of the TFT inside the pixel, so correct writing of the brightness data at a high speed becomes possible. Note that, it is also possible to configure the precharge use element by a TFT or configure the same by an external part separately from the TFT process.

Figure 26:
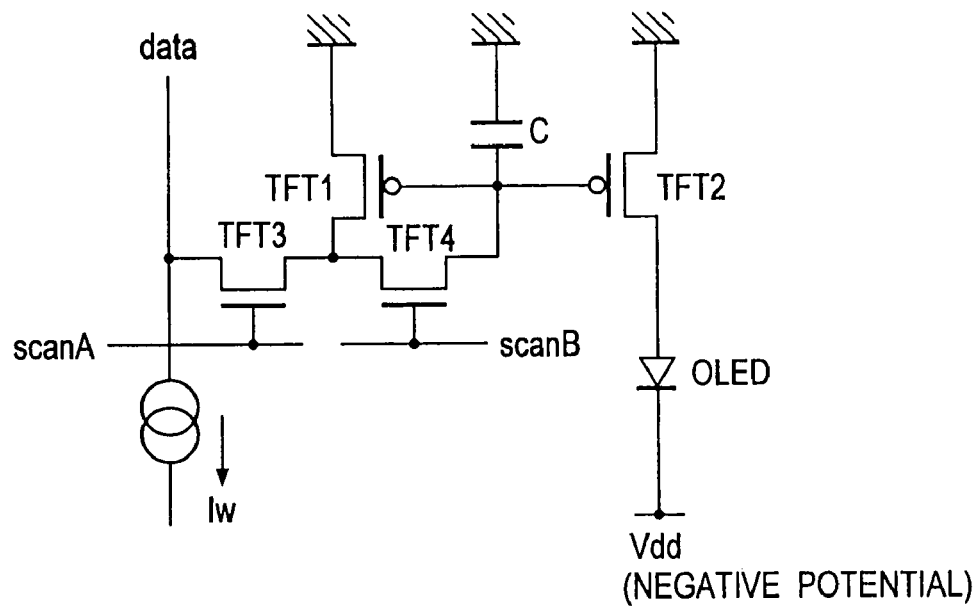
FIG. 26 is a circuit diagram of another embodiment of the pixel circuit according to the present invention.

FIG. 26 is another embodiment of the pixel circuit according to the present invention. In this circuit, unlike the circuits of the examples mentioned before, the conductivity types of the TFT1 and the TFT2 are achieved by the P-channel type (PMOS). Along with this, for the above reason, the TFT3 is configured as the N-channel type (NMOS) as a conductivity type different from that of the TFT1. The TFT4 is configured as the N-channel type (NMOS) as the identical conductivity type to that of the TFT3 in consideration with the controllability.

In the circuit of FIG. 26, the two transistors TFT1 and TFT2 operate by equal gate-source voltages at the time of driving the light emitting element OLED, but the drain-source voltages are not always equal. In order to achieve a correct proportion between the write current Iw and the drive current of the light emitting element OLED, desirably the TFT2 is operated in the saturated region as previously mentioned. On the other hand, in the case of an NMOS, generally an LDD (lightly doped drain) structure is employed in order to improve the withstand voltage. This is because, in this case, the drain current is easily influenced by the drain-source voltage in the saturated region. In other words, the constant current property tends to be inferior to an PMOS due to a serial resistance component by the LDD.

Accordingly, preferably the conversion use thin film transistor TFT1 and the drive use thin film transistor TFT2 are configured by PMOSs.

The operation of this circuit is basically similar to that of the circuit of FIG. 5 etc. except for the point that the polarities of the elements become reverse.

Figure 27:
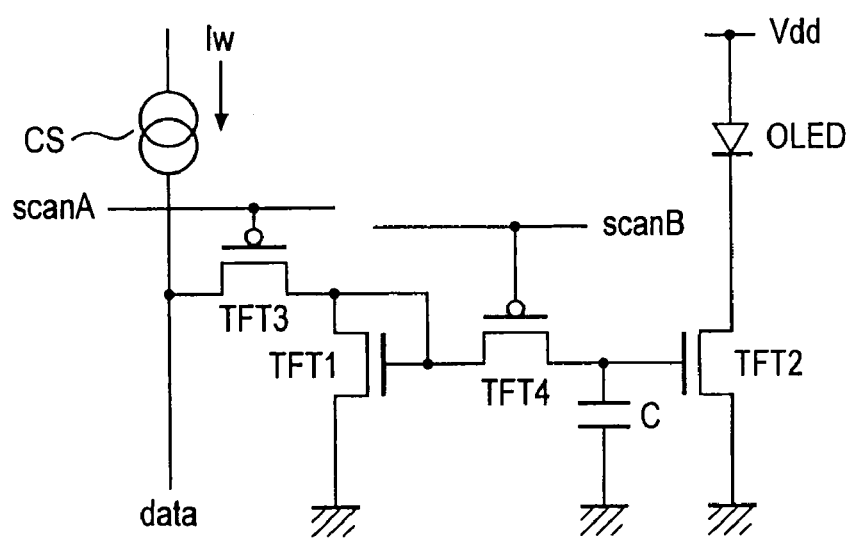
FIG. 27 is a circuit diagram of another embodiment of the pixel circuit according to the present invention.

FIG. 27 shows another embodiment of the pixel circuit according to the present invention. Unlike the circuits of the examples mentioned above, this circuit is configured so that, in place of connecting the switch use thin film transistor TFT4 between the drain and the gate of the conversion use thin film transistor TFT1, the drain and the gate of the TFT1 are directly connected, and the TFT4 is connected between a connection point of them and the connection point between the gate of the TFT2 and the capacitor.

Also in this circuit of FIG. 27, basically the operation the same way as that in the circuit of FIG. 5 etc. is possible. Further, also in this circuit, the TFT3 and the TFT4 may be identical or different conductivity types, the gates of them are controlled by different scanning lines such as the first scanning line SCAN-A and the second scanning line SCAN-B, and the TFT4 brought to the off state preceding the TFT3 at the end of the write operation. Further, as explained in relation to FIG. 21, in order to reliably terminate the write operation in the predetermined scanning line cycle, desirably the size (W/L) of the TFT1 is set larger than the size of the TFT2.

INDUSTRIAL APPLICABILITY

As described above, by the current drive circuit according to the present invention and the display device using the same, it is possible to pass a drive current Idrv correctly proportional (or corresponding) to the signal current Iw from a data line through a current drive type light emitting element (organic EL element or the like) without being affected by variations in the characteristics of the active element (TFT etc.) By arranging a large number of pixel circuits including such current drive circuits in a matrix, each pixel can be made to correctly emit light with the intended brightness. Therefore it is possible to provide a high quality active matrix type display device.

The invention claimed is:

1. A current drive circuit for supplying a drive current to a driven object, including:
   a control line,
   a signal line to which a signal current having a current level in accordance with information is supplied,
   a receiving part for fetching the signal current from the signal line when the control line selected,
   a converting part for converting a current level of the fetched signal current to a voltage level and holding the same, and
   a drive part for converting the held voltage signal to a current signal and outputting the drive current, wherein
   the receiving part includes a fetch use insulating gate type field effect transistor having a control terminal, a first terminal, and a second terminal, the first terminal connected to a first terminal of the conversion use transistor the second terminal connected to the signal line, and the control terminal connected to the control line, and
   the converting part includes a switch use transistor inserted between the first terminal and control terminal of the conversion use transistor.

2. A current drive circuit as set forth in claim 1, wherein the control terminal of the fetch use transistor and the control terminal of the switch use transistor are connected to different control lines.

3. A current drive circuit as set forth in claim 1, wherein a conductivity type of the conversion use transistor and a conductivity type of the fetch use transistor are different.

4. A current drive circuit for supplying a drive current to a driven object, including:
   at least one control line,
   a signal line to which a signal current having a current level in accordance with information is supplied,
   a conversion use insulating gate type field effect transistor with a source connected to a reference potential,
   a fetch use insulating gate type field effect transistor connected between a drain of said conversion use insulating gate type field effect transistor and said signal line and having a gate connected to a said control line,
   a drive use insulating gate type field effect transistor connected between the reference potential and said driven object,
   a capacitor having a first electrode connected in common to a gate of said conversion use insulating gate type field effect transistor and a gate of said drive use insulating gate type field effect transistor and having a second electrode connected to the reference potential, and
   a switch use insulating gate type field effect transistor connected between a gate and drain of said conversion use insulating gate type field effect transistor and having a gate connected to said control line.

5. A current drive circuit for supplying a drive current to a driven object, including:
   at least one control line,
   a signal line to which a signal current having a current level in accordance with information is supplied,
   a conversion use insulating gate type field effect transistor with a source connected to a reference potential,
   a fetch use insulating gate type field effect transistor connected between a drain of said conversion use insulating gate type field effect transistor and said signal line and having a gate connected to said control line,
   a drive use insulating gate type field effect transistor connected between the reference potential and said driven object,
   a capacitor having a first electrode connected to a gate of said drive use insulating gate type field effect transistor and having a second electrode connected to a reference potential, and
   a switch use insulating gate type field effect transistor connected between a gate of said conversion use insulating gate type field effect transistor and a connecting point of a gate of said drive use insulating gate type field effect transistor and a first electrode of said capacitor and having a gate connected to said control line,
   wherein a control terminal of said fetch use insulating gate type field effect transistor and a control terminal of said switch use insulating gate type field effect transistor are connected to different control lines.

6. A display device, comprising:
   a scanning line,
   a data line to which a signal in accordance with brightness information is supplied, and
   a pixel comprising a display element formed at an intersecting portion of said data line and said scanning line,
   said pixel comprising
   a receiving part for fetching the signal supplied to the data line when the scanning line is selected,
   a converting and holding part for converting and holding the fetched signal, and
   a drive part for converting the held signal and supplying it to said display element,
   wherein said converting and holding part comprises a plurality of transistors provided with control terminals and a plurality of capacitors connected to the control terminals.

7. A display device comprising:
   a scanning line,
   a data line to which a current signal in accordance with brightness information is supplied, and
   a pixel comprising an organic layer formed at an intersecting portion of said data line and said scanning line,
   said pixel comprising
   a receiving part for fetching the current signal supplied to the data line when the scanning line is selected,
   a converting and holding part for converting the fetched current signal to a voltage and holding the same, and
   a drive part for converting the held voltage signal and supplying a current to said display element, wherein said converting and holding part comprises a first transistor provided with a control terminal and one end of a capacitor connected to said control terminal, wherein said converting and holding part comprises a second transistor connected between the first terminal of said first transistor and said control terminal.

8. A display device as set forth in claim 7, wherein said second transistor becomes conductive in state when said signal supplied to the data line is fetched by said receiving part and becomes nonconductive in state after the signal is supplied to said converting and holding part.

9. A display device as set forth in claim 7, wherein
said receiving part comprises a third transistor having a first terminal connected to the first terminal of said first transistor and a second terminal connected to said data line and
the control terminal of said second transistor and the control terminal of said third transistor are connected to different scanning lines.

10. A display device as set forth in claim 7, wherein said drive part comprises a third transistor having a control terminal connected to the control terminal of said first transistor and wherein said first, second, and third transistors configure a current mirror circuit.

11. A display device as set forth in claim 10, wherein the control terminal of said second transistor is connected to said capacitor.

12. A display device, comprising:
a scanning line,
a data line to which a signal in accordance with brightness information is supplied, and
a pixel comprising a display element formed at an intersecting portion of said data line and said scanning line, said pixel comprising
a receiving part for fetching the signal supplied to the data line when the scanning line is selected,
a converting and holding part for converting and holding the fetched signal, and
a drive part for converting the held signal and supplying it to said display element,
wherein said converting and holding part comprises a first transistor provided with a control terminal and one end of a capacitor connected to said control terminal,
wherein said converting and holding part comprises a second transistor connected between the first terminal of said first transistor and said control terminal.

13. A display device as set forth in claim 12, wherein said second transistor becomes conductive in state when said signal supplied to the data line is fetched by said receiving part and becomes nonconductive in state after the signal is supplied to said converting and holding part.

14. A display device as set forth in claim 12, wherein
said receiving part comprises a third transistor having a first terminal connected to the first terminal of the first transistor and a second terminal connected to said data line and
the control terminal of said second transistor and the control terminal of said third transistor are connected to different scanning lines.

15. A display device as set forth in claim 12, wherein said drive part comprises a third transistor having a control terminal connected to the control terminal of said first transistor and wherein said first, second, and third transistors configure a current mirror circuit.

16. A display device as set forth in claim 15, wherein the control terminal of said second transistor is connected to said capacitor.

17. A display device comprising
a scanning line drive circuit for successively selecting scanning lines,
a data line drive circuit including a current source for generating a signal current having a current level in accordance with brightness information and successively supplying the same to data lines, and
a plurality of pixels arranged at intersecting portions of the scanning lines and the data lines and including current driven type light emitting elements emitting light by receiving the supply of the drive current,
wherein each pixel comprises
a receiving part for fetching the signal current from a data line when the scanning line is selected,
a converting part for converting a current level of the fetched signal current to a voltage level and holding the same, and
a drive part for passing a drive current having a current level in accordance with the held voltage level through the light emitting element,
wherein an initial value setting element for setting said data to an initial value before said scanning line is selected is connected between said data line and a predetermined potential,
wherein:
the drive part includes an insulating gate type field effect transistor having a gate, a drain, and a source,
the converting part is provided with a capacitor connected to the gate of the thin film transistor and holding the voltage level, and
the adjusting means comprises an additional capacitor connected to that capacitor and downwardly adjusts the level of the voltage to be applied to the gate of the insulating gate type field effect transistor held at that capacitor.

18. A display device as set forth in claim 17, wherein
the drive part includes an insulating gate type field effect transistor having a gate, a drain, and a source,
the converting part is provided with a capacitor connected to the gate of the insulating gate type field effect transistor on its one end and holding the voltage level, and
the adjusting means adjusts the potential of the other end of the capacitor when holding the voltage level converted by the converting part at that capacitor to downwardly adjust the level of the voltage to be applied to the gate of the insulating gate type field effect transistor.

19. A display device as set forth in claim 17, wherein the light emitting element comprises an organic electroluminescence element.

20. A display device as set forth in claim 17, wherein the drive use insulating gate type field effect transistor comprises a P-channel type.

21. A display device comprising a scanning line drive circuit for successively selecting scanning lines,
a data line drive circuit including a current source for generating a signal current having a current level in accordance with brightness information and successively supplying the same to data lines, and
a plurality of pixels arranged at intersecting portions of the scanning lines and the data lines and including current driven type light emitting elements emitting light by receiving the supply of the drive current, wherein each pixel comprises
a conversion use insulating gate type field effect transistor having a source connected to a reference potential,
a fetch use insulating gate type field effect transistor inserted between the drain of the conversion use insulating gate type field effect transistor and the data line and having a gate connected to a scanning line,
a drive use insulating gate type field effect transistor connected between a reference potential and a light emitting element,
a capacitor having a first electrode connected in common to a gate of the conversion use insulating gate type field effect transistor and a gate of the drive use insulating gate type field effect transistor and having a
second electrode connected to a reference potential, and a switch use insulating gate type field effect transistor connected between a gate and drain of said conversion use insulating gate type field effect transistor and having a gate connected to a scanning line.

22. A display device comprising
a scanning line drive circuit for successively selecting scanning lines,
a data line drive circuit including a current source for generating a signal current having a current level in accordance with brightness information and successively supplying the same to data lines, and
a plurality of pixels arranged at intersecting portions of the scanning lines and the data lines and including current driven type light emitting elements emitting light by receiving the supply of the drive current, wherein
each pixel comprises
a conversion use insulating gate type field effect transistor having a source connected to a reference potential,
a fetch use insulating gate type field effect transistor connected between the drain of the conversion use insulating gate type field effect transistor and the data line and having a gate connected to a scanning line,
a drive use insulating gate type field effect transistor connected between a reference potential and a light emitting element,
a capacitor having a first electrode connected to a gate of the drive use insulating gate type field effect transistor and having a second electrode connected to a reference potential, and
a switch use insulating gate type field effect transistor connected between a gate of said conversion use insulating gate type field effect transistor and a connecting point between a gate of said drive use insulating gate type field effect transistor and a first electrode of said capacitor and having a gate connected to a scanning line,
wherein the control terminal of the fetch use insulating gate type field effect transistor and the control terminal of the switch use insulating gate type field effect transistor are connected to different scanning lines.

23. A display device as set forth in claim 22, wherein the size of the conversion use insulating gate type field effect transistor is set larger than the size of the drive use insulating gate type field effect transistor.

24. A display device as set forth in claim 22, wherein the switch use insulating gate type field effect transistor is made conductive after a predetermined time within one frame period after the switch use insulating gate type field effect transistor and the fetch use insulating gate type field effect transistor become nonconductive to extinguish in units of scanning lines.

25. A pixel circuit as set forth in claim 22, wherein the light emitting element comprises an organic electroluminescence element.

26. A display device comprising
a scanning line drive circuit for successively selecting scanning lines,
a data line drive circuit including a current source for generating a signal current having a current level in accordance with brightness information and successively supplying the same to data lines, and
a plurality of pixels arranged at intersecting portions of the scanning lines and the data lines and including current driven type light emitting elements emitting light by receiving the supply of the drive current,
wherein each pixel comprises
a receiving part for fetching the signal current from a data line when the scanning line is selected,
a converting part for converting a current level of the fetched signal current to a voltage level and holding the same, and
a drive part for passing a drive current having a current level in accordance with the held voltage level through the light emitting element,
wherein:
the receiving part includes a fetch use insulating gate type field effect transistor inserted between the drain of the conversion use insulating gate type field effect transistor and the data line, and
the converting part includes a switch use insulating late type field effect transistor inserted between the drain and the gate of the conversion use insulating gate type field effect transistor.

27. A display device as set forth in claim 26, wherein the gate of the fetch use insulating gate type field effect transistor and the gate of the switch use insulating gate type field effect transistor are connected to different scanning lines.

28. A display device as set forth in claim 27, wherein
the switch use insulating gate-type field effect transistor becomes conductive when converting the current level of the signal current to the voltage level and electrically connects the drain and the gate of the conversion use insulating gate type field effect transistor to create the voltage level with the source as the reference at the gate,
the switch use insulating gate type field effect transistor is cut off and separates the gate of the conversion use insulating gate type field effect transistor and the capacitor connected to this from the drain when the capacitor holds the voltage level, and
the switch use insulating gate type field effect transistor becomes unselected and is cut off before the fetch use insulating gate type field effect transistor becomes nonconductive.

29. A display device as set forth in claim 28, wherein the switch use insulating gate type field effect transistor is made conductive after a predetermined time within one frame period after the switch use insulating gate type field effect transistor and the fetch use insulating gate type field effect transistor become nonconductive to extinguish in units of scanning lines.

30. A display device as set forth in claim 28, wherein a scanning line to which the switch use insulating gate type field effect transistor is connected is provided independently for each of the three primary colors.

31. A display device as set forth in claim 26, wherein a conductivity type of said switch use insulating gate type field effect transistor and a conductivity type of said fetch use insulating gate type transistor are different.

32. A pixel circuit for driving a current-driven type light emitting element arranged at an intersecting portion of a data line supplying a signal current of a current level in accordance with brightness information and a scanning line supplying a selection pulse and emitting light by the drive current, comprising
  a receiving part for fetching the signal current from said data line in response to a selection pulse from said scanning line,
  a converting part for converting a current level of the fetched signal current to a voltage level and holding the same, and
  a drive part for passing a drive current having a current level in accordance with the held voltage level through the light emitting element,
  wherein:
  the receiving part includes a fetch use insulating gate type field effect transistor inserted between the drain of the conversion use insulating gate type field effect transistor and the data line and
  the converting part includes a switch use insulating gate type field effect transistor inserted between the drain and the gate of the conversion use insulating gate type field effect transistor.

33. A pixel circuit as set forth in claim 32, wherein the gate of the fetch use insulating gate type field effect transistor and the gate of the switch use insulating gate type field effect transistor are connected to different scanning lines.

34. A pixel circuit as set forth in claim 33, wherein
  the switch use insulating gate type field effect transistor becomes conductive when converting the current level of the signal current to the voltage level and electrically connects the drain and the gate of the conversion use insulating gate type field effect transistor to create the voltage level with the source as the reference at the gate,
  the switch use insulating gate type field effect transistor is cut off and separates the gate of the conversion use insulating gate type field effect transistor and the capacitor connected to this from the drain when the capacitor holds the voltage level, and
  the switch use insulating gate type field effect transistor becomes unselected and is cut off before the fetch use insulating gate type field effect transistor becomes nonconductive.

35. A pixel circuit as set forth in claim 34, wherein the switch use insulating gate type field effect transistor is made conductive after a predetermined time within one frame period after the switch use insulating gate type field effect transistor and the fetch use insulating gate type field effect transistor become nonconductive to extinguish in units of scanning lines.

36. A pixel circuit as set forth in claim 32, wherein a conductivity type of said switch use insulating gate type field effect transistor and a conductivity type of said fetch use insulating gate type transistor are different.

37. A pixel circuit as set forth in claim 32, wherein the drive use insulating gate type field effect transistor comprises a P-channel type.

38. A pixel circuit for driving a current-driven type light emitting element arranged at an intersecting portion of a data line supplying a signal current of a current level in accordance with brightness information and a scanning line supplying a selection pulse and emitting light by the drive current, comprising
  a receiving part for fetching the signal current from said data line in response to a selection pulse from said scanning line,
  a converting part for converting a current level of the fetched signal current to a voltage level and holding the same, and
  a drive part for passing a drive current having a current level in accordance with the held voltage level through the light emitting element, and
  an adjusting means for downwardly adjusting the voltage level held by the converting part and supplying the same to the drive part to tighten the black level of the brightness of each pixel,
  wherein
  the drive part includes an insulating gate type field effect transistor having a gate, a drain, and a source,
  the converting part is provided with a capacitor connected to the gate of the thin film transistor and holding the voltage level, and
  the adjusting means comprises an additional capacitor connected to that capacitor and downwardly adjusts the level of the voltage to be applied to the gate of the insulating gate type field effect transistor held at that capacitor.

39. A pixel circuit as set forth in claim 38, wherein
  the drive part includes an insulating gate type field effect transistor having a gate, a drain, and
  a source, the converting part is provided with a capacitor connected to the gate of the insulating gate type field effect transistor on its one end and holding the voltage level, and
  the adjusting means adjusts the potential of the other end of the capacitor when holding the voltage level converted by the converting part at that capacitor to downwardly adjust the level of the voltage to be applied to the gate of the insulating gate type field effect transistor.

40. A pixel circuit for driving a current-driven type light emitting element arranged at an intersecting portion of a data line supplying a signal current of a current level in accordance with brightness information and a scanning line supplying a selection pulse and emitting light by the drive current, comprising
  a conversion use insulating gate type field effect transistor having a source connected to a reference potential,
  a fetch use insulating gate type field effect transistor inserted between the drain of the conversion use insulating gate type field effect transistor and the data line and having a gate connected to a scanning line,
  a drive use insulating gate type field effect transistor connected between a reference potential and a light emitting element,
  a capacitor having a first electrode connected in common to a gate of the conversion use insulating gate type field effect transistor and a gate of the drive use insulating gate type field effect transistor and having a second electrode connected to a reference potential, and
  a switch use insulating gate type field affect transistor connected between a gate and drain of said conversion use insulating gate type field effect transistor and having a gate connected to a scanning line.

41. A pixel circuit for driving a current-driven type light emitting element arranged at an intersecting portion of a data line supplying a signal current of a current level in accordance with brightness information and a scanning line supplying a selection pulse and emitting light by the drive current, comprising a conversion use insulating gate type field effect transistor having a source connected to a reference potential, a fetch use insulating gate type field effect transistor connected between the drain of the conversion use insulating gate type field effect transistor and the data line and having a gate connected to a scanning line, a drive use insulating gate type field effect transistor connected between a reference potential and a light emitting element, a capacitor having a first electrode connected to a gate of the drive use insulating gate type field effect transistor and having a second electrode connected to a reference potential, and a switch use insulating gate type field effect transistor connected between a gate of said conversion use insulating gate type field effect transistor and a connecting point between a gate of said drive use insulating gate type field effect transistor and a first electrode of said capacitor and having a gate connected to a scanning lines, wherein the control terminal of the fetch use insulating gate type field effect transistor and the control terminal of the switch use insulating gate type field effect transistor are connected to different scanning lines.

42. A pixel circuit as set forth in claim 41, wherein the size of the conversion use insulating gate type field effect transistor is set larger than the size of the drive use insulating gate type field effect transistor.

43. A pixel circuit as set forth in claim 41, wherein the switch use insulating gate type field effect is made conductive after a predetermined time within one frame period after the switch use insulating gate type field effect transistor and the fetch use insulating gate type field effect transistor become nonconductive to extinguish in units of scanning lines.

44. A method of driving a light emitting element for driving a current-driven type light emitting element arranged at an intersecting portion of a data line supplying a signal current of a current level in accordance with brightness information and a scanning line supplying a selection pulse and emitting light by the drive current, comprising a receiving routine for fetching the signal current from said data line in response to a selection pulse from said scanning line, a converting routine for converting a current level of the fetched signal current to a voltage level and holding the same, a drive routine for passing a drive current having a current level in accordance with the held voltage level through the light emitting elements, wherein the converting routine includes a routine using a conversion use insulating gate type field effect transistor provided with a gate, a source, a drain, and a channel and a capacitor connected to the gate, in the routine, the conversion use insulating gate type field effect transistor creates the voltage level converted by passing the fetched signal current though the channel in the receiving routine at the gate, and the capacitor holds voltage level created at the gate, wherein the converting routine includes a routine using a switch use insulating gate type field effect transistor inserted between the drain and the gate of the conversion use insulating gate type field effect transistor, in the routine, the switch use insulating gate type field effect transistor becomes conductive when converting the current level of the signal current to the voltage level and electrically connects the drain and the gate of the conversion use insulating gate type field effect transistor to create the voltage level with the source as the reference at the gate, and the switch use insulating gate type field effect transistor is cut off and separates the gate of the conversion use insulating gate type field effect transistor and the capacitor connected to this from the drain when the capacitor holds the voltage level.

45. A method of driving a light emitting element as set forth in claim 44, wherein the converting routine includes a routine using a conversion use insulating gate type field effect transistor provided with a gate, a source, a drain, and a channel and a capacitor connected to the gate, in the routine, the conversion use insulating gate type field effect transistor creates the voltage level converted by passing the fetched signal current though the channel in the receiving routine at the gate, and the capacitor holds voltage level created at the gate.

46. A method of driving a light emitting element as set forth in claim 45, wherein:

said drive routines includes a routine using a drive use insulating gate type field effect transistor provided with a gate, a drain, a source, and a channel, and in the routine, the drive use insulating gate type field effect transistor receives the voltage level held at the capacitor at its gate and passes a drive current having a current level in accordance with that through the light emitting element via the channel.

47. A method of driving a light emitting element as set forth in claim 46, wherein the gate of the conversion use insulating gate type field effect transistor and the gate of the drive use insulating gate type field effect transistor are directly connected to configure a current mirror circuit and wherein the current level of the signal current and the current level of the drive current are proportional.

48. A method of driving a light emitting element as set forth in claim 46, wherein the drive use insulating gate type field effect transistor is formed in the vicinity of the corresponding conversion use insulating gate type field effect transistor inside the pixel and has an equivalent threshold voltage to that of the conversion use insulating gate type field effect transistor.

49. A method of driving a light emitting element as set forth in claim 48, wherein the drive use insulating gate type field effect transistor operates in the saturated region and passes a drive current in accordance with a difference between the level of the voltage applied to the gate thereof and the threshold voltage through the light emitting element.

50. A method of driving a light emitting element as set forth in claim 45, wherein the receiving routine, the converting routine, and the drive routine are executed on a current circuit combining a plurality of insulating gate type field effect transistors, and one or two or more insulating gate type field effect transistors have a double gate structure for suppressing current leakage in the current circuit.

51. A method of driving a light emitting element as set forth in claim 44, wherein the drive routine is performed using an insulating gate type field effect transistor provided with a gate, drain, and a source and passes the drive current passing between the drain and the source to the light emitting element in accordance with the level of the voltage applied to the gate, and the light emitting element is a two terminal type having an anode and a cathode, where the cathode is connected to the drain.

52. A method of driving a light emitting element as set forth in claim 44, wherein the drive routine is performed using an insulating gate type field effect transistor provided with a gate, a drain, and a source and passes a drive current passing between the drain and the source to the light emitting element in accordance with the level of the voltage applied to the gate, and the light emitting element is a two terminal type having an anode and a cathode, where the anode is connected to the source.

53. A method of driving a light emitting element as set forth in claim 44, wherein the light emitting element comprises an organic electroluminescence element.

54. A method of driving a light emitting element as set forth in claim 44, further including an adjusting routine for downwardly adjusting the voltage level held by the converting routine and supplying the same to the drive part to tighten the black level of the brightness of each pixel.

55. A method of driving a light emitting element as set forth in claim 54, wherein the drive routine includes uses an insulating gate type field effect transistor having a gate, a drain, and a source, and the adjusting routine downwardly adjusts the level of the voltage applied to the gate by raising the bottom of the voltage between the gate and the source of the insulating gate type field effect transistor.

56. A method of driving a light emitting element as set forth in claim 54, wherein the drive routine uses an insulating gate type field effect transistor having a gate, a drain, and a source, the converting routine uses a capacitor connected to the gate of the thin film transistor and holding the voltage level, and the adjusting routine uses an additional capacitor connected to that capacitor and downwardly adjusts the level of the voltage to be applied to the gate of the insulating gate type field effect transistor held at that capacitor.

57. A method of driving a light emitting element as set forth in claim 54, wherein the drive routine uses an insulating gate type field effect transistor having a gate, a drain, and a source, the converting routine uses a capacitor connected to the gate of the insulating gate type field effect transistor on its one end and holding the voltage level, and the adjusting means routine adjusts the potential of the other end of the capacitor when holding the voltage level converted by the converting routine at that capacitor to downwardly adjust the level of the voltage to be applied to the gate of the insulating gate type field effect transistor.

* * * * *

UNITED STATES PATENT AND TRADEMARK OFFICE
CERTIFICATE OF CORRECTION

PATENT NO.       : 7,379,039 B2
APPLICATION NO.  : 10/784828
DATED            : May 27, 2008
INVENTOR(S)      : Akira Yumoto It is certified that error appears in the above-identified patent and that said Letters Patent is hereby corrected as shown below:

Title page:
Item [62] should read: -- Division of application No. 09/787,036, filed as application No. PCT/JP00/04763 on Jul. 14, 2000, now Pat. No. 6,859,193 --.

Column 30, Line 30 Claim 26:
"late" should read -- gate --.

Column 32, Line 58 Claim 29:
"affect" should read -- effect --.

Column 33, Line 20 Claim 41:
"lines" should read -- line --.

Column 33, Line 50 Claim 44:
"elements" should read -- element --.

Column 35, Line 28 Claim 55:
"includes" should be deleted.

Signed and Sealed this

Twelfth Day of August, 2008

JON W. DUDAS
*Director of the United States Patent and Trademark Office*